United States Patent [19]

Allen et al.

[11] Patent Number: 4,648,060

[45] Date of Patent: Mar. 3, 1987

[54] DUAL CHANNEL FREQUENCY SYNTHESIZER SYSTEM

[75] Inventors: Curtis M. Allen; Larry J. Smith, both of Everett, Wash.

[73] Assignee: Hewlett-Packard Company, Palo Alto, Calif.

[21] Appl. No.: 635,949

[22] Filed: Jul. 30, 1984

[51] Int. Cl.<sup>4</sup> ............................ G06G 7/00; G06J 1/00
[52] U.S. Cl. .................................. 364/851; 364/607; 364/718; 331/2
[58] Field of Search ........ 364/607, 718, 721, 851–852, 364/855, 858; 307/43, 72–73; 328/13–15, 17–18; 331/2, 46–48, 55–56, 58

[56] References Cited

U.S. PATENT DOCUMENTS

| | | | |
|---|---|---|---|
| 3,529,144 | 9/1970 | Patterson et al. | 364/851 X |
| 3,573,451 | 4/1971 | Fricke, Jr. et al. | 364/851 X |
| 3,769,500 | 10/1973 | Schlatter | 364/851 X |
| 3,831,015 | 8/1974 | Hoff, Jr. | 364/718 X |
| 3,927,384 | 12/1975 | Jezo | 331/2 |
| 4,017,801 | 4/1977 | Riedel | 364/858 X |
| 4,070,634 | 1/1978 | Barker et al. | 331/2 |
| 4,322,692 | 3/1982 | Brewerton et al. | 331/2 |
| 4,499,550 | 2/1985 | Ray, III et al. | 364/851 X |
| 4,528,522 | 7/1985 | Matsuura | 331/2 |

Primary Examiner—Gary V. Harkcom
Attorney, Agent, or Firm—Leslie G. Murray

[57] ABSTRACT

A signal synthesizer system allowing a wide variety of signal sources for test and evaluation is provided. In one embodiment, the signal synthesizer system is a phase calibration system resulting in a wideband, variable phase two channel synthesized source with good phase accuracy over its entire frequency range.

26 Claims, 22 Drawing Figures

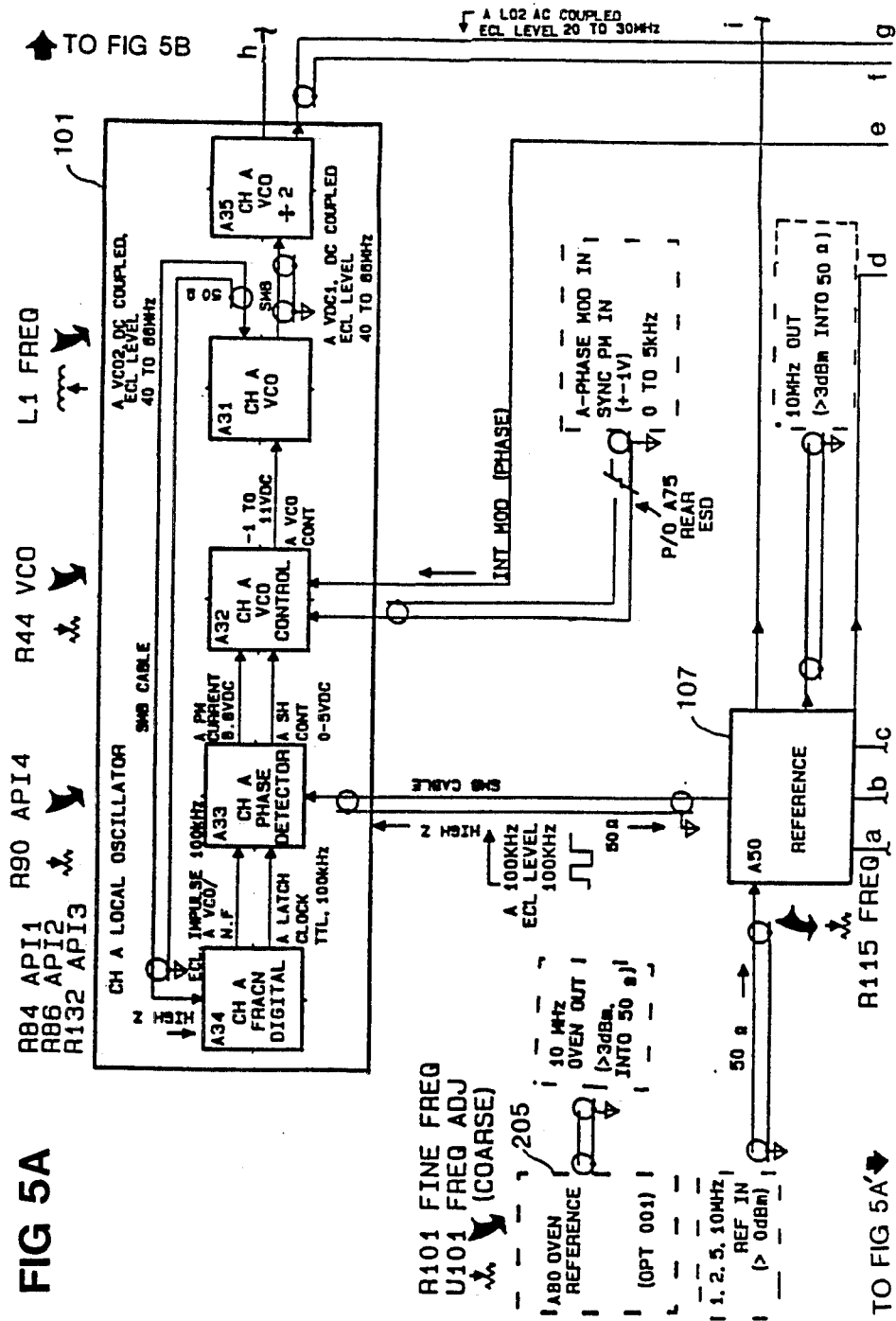

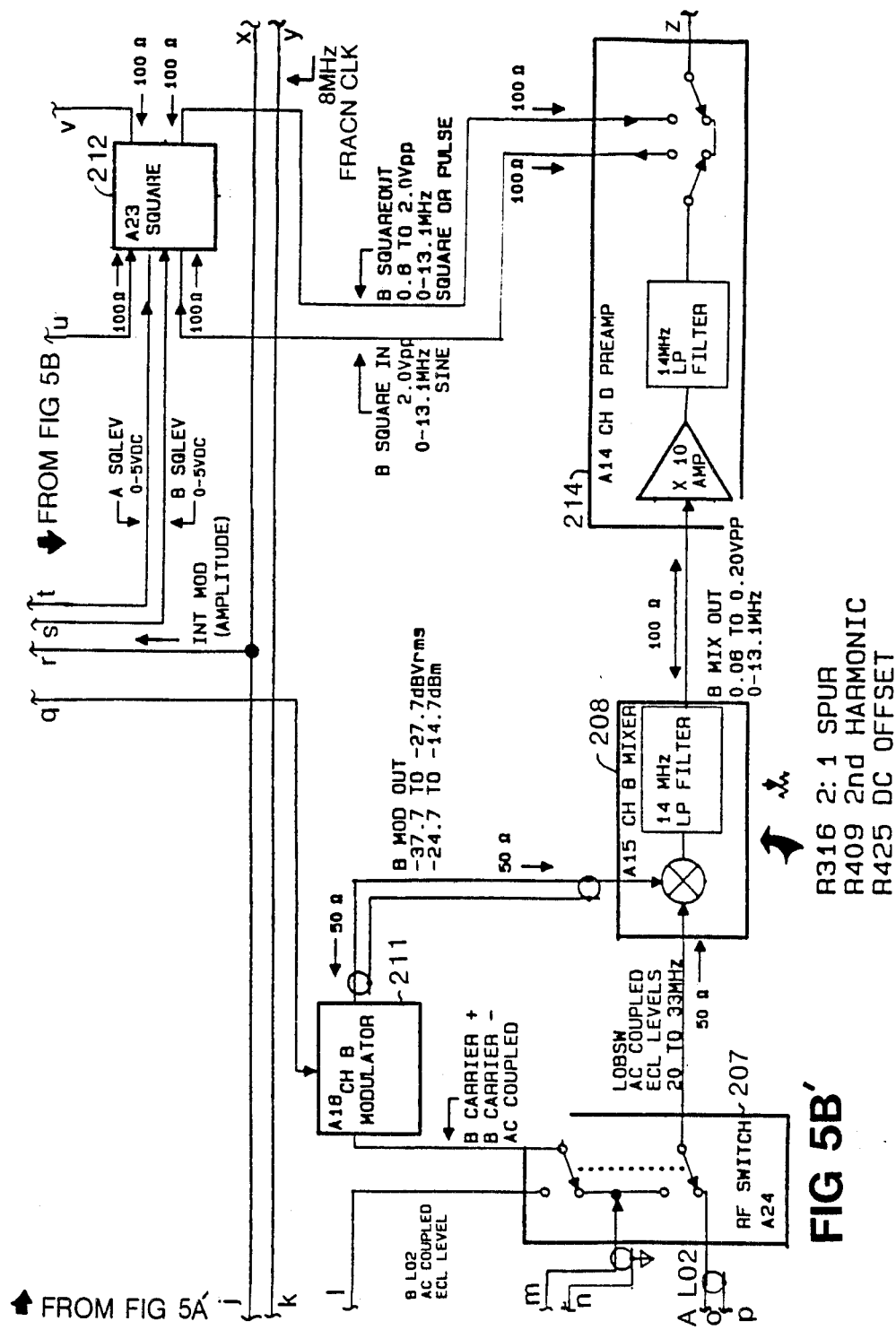

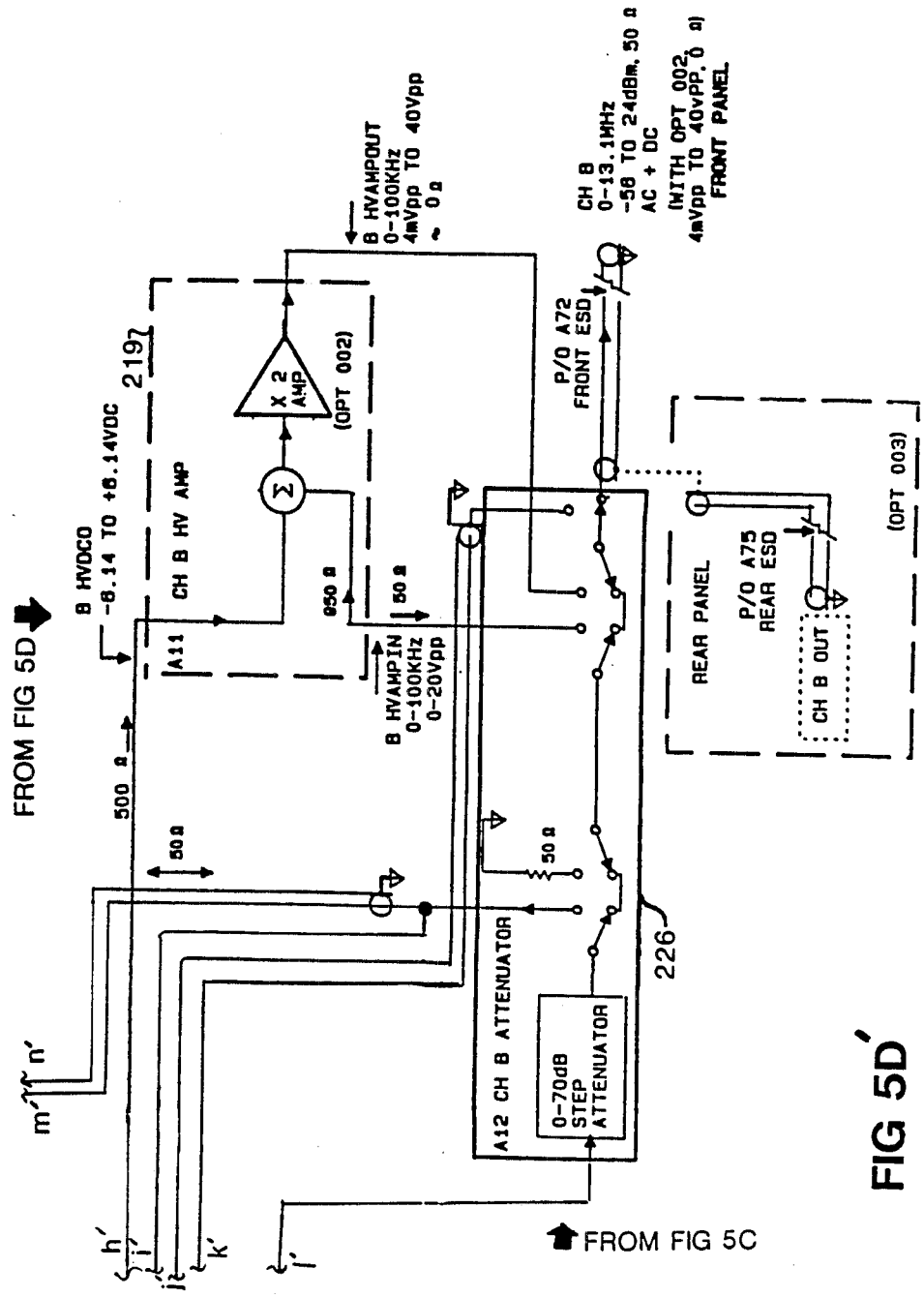

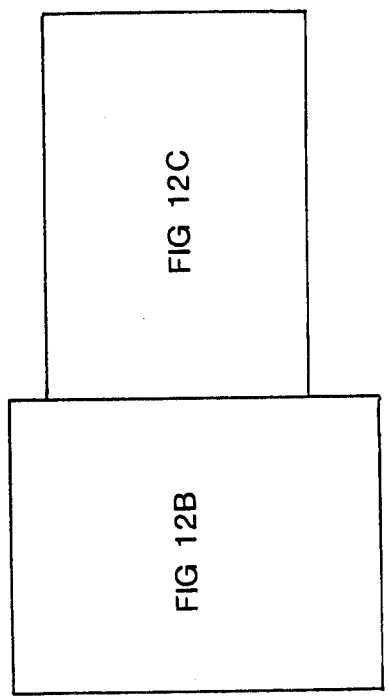

DUAL CHANNEL FREQUENCY SYNTHESIZER SYSTEM

BACKGROUND OF THE INVENTION

The present invention relates to a signal synthesizer system allowing a wide variety of signal sources for test and evaluation, and more particularly relates to a two channel signal synthesizer system having a variety of capabilities to generate a wide range of complex signals.

Most signal synthesizer systems provide precision waveforms of signals with frequency accuracy and resolution for test and evaluation of electrical measurement. For example, a single channel synthesizer system can be synthesizer, function generator and sweep generator providing sinewaves and square, triangle and ramp waveforms for use. As a synthesizer, the single channel system provides waveforms with precise frequency. As a function generator, the synthesizer system provides a variety of waveforms including sine, square, triangle, and ramp. As a sweep generator the synthesizer can sweep over a range of frequencies. However, there is a high demand for much improved performance of the synthesizer system in spectral purity, phase noise and phase accuracy. Furthermore, it is important to provide the synthesizer system with a variety of additional capabilities.

In the case of providing two calibrated phase outputs, a function generator can be phase locked to an external reference signal, and provide an output signal of the same frequency and variable phase offset. But these kind of phase lock generators have several disadvantages in regard to phase accuracy, phase resolution, frequency range and manual operation.

SUMMARY OF THE INVENTION

In accordance with a preferred embodiment of the present invention, there is provided a new signal synthesizer system. The signal synthesizer system is a precision two channel synthesizer having a variety of capabilities which are made possible by having two independently controlled sources with a common controller residing in one instrument. In addition to its flexibility, the signal synthesizer system offers spectrally pure signals on each of the channels.

In regard to operating modes of the synthesizer system, there are provided four new operating modes which are two channel mode, two phase mode, two tone mode, and pulse mode. Within each of these modes, a variety of modulations and waveforms are provided Also, in addition to fixed synthesized frequencies, phase continuous sweeping is available in all modes. In the two channel mode, independent frequencies are available from the two output channels. When in the two phase mode, the frequency output of both channels is the same with an alterable phase offset of one channel with respect to the other channel. When in the two tone mode, different output frequencies are available from each channel with settable frequency offset. When in the pulse mode, a variable duty cycle square wave is output from one channel and its complement with respect to duty cycle is output from the other channel.

Another object of this invention is to provide a phase calibration system which results in being a wideband, variable phase two channel synthesized source with good phase accuracy over its entire frequency range. There are three new configurations for the phase calibration system which are internal calibration, external calibration, and multi phase calibration. The internal calibration results in phase of one channel with respect to the other channel being calibrated at the outputs on the front panel. Phase calibration is done in the two phase mode for sine or square function or in the pulse mode. The external calibration allows phase calibration at a point external to the system. The phase calibration is done for the two phase mode in square or sine function. The multi phase calibration allows phase calibration of both signals with a third, external signal at the same frequency. Using several instruments in this fashion, this has the effect of providing multi channel phase calibrated signals.

In addition to these advantages described above, the synthesizer system of the present invention has the following three contributions. First, use of one oscillator as a variable phase reference allows phase between the two channels to be constant over frequency with good stability between calibration periods. This includes phase continuity through sweep. Second, use of one oscillator as a variable frequency reference allows the channel frequency to maintain a precise frequency offset from the other channel with minimal phase noise. Also, this precision offset is maintained during a sweep of the other channel. Third, with two channels in one instrument and the addition of the phase calibration system, very good phase accuracy is maintained. The phase calibration technique of the present invention allows theoretically zero phase error for equal level sines, and utilizes an unique attenuator switching technique to characterize and correct for phase errors introduced by difference between levels in the two channels. Hence, the present invention provides us with a new signal synthesizer system.

BRIEF DESCRIPTION OF THE DRAWINGS

FIGS. 12A-12C are a detailed circuit diagram of the embodiment describing the detailed circuit configuration of the phase calibration system of the signal synthesizer system.

DESCRIPTION OF THE PREFERRED EMBODIMENT

Figure 1:
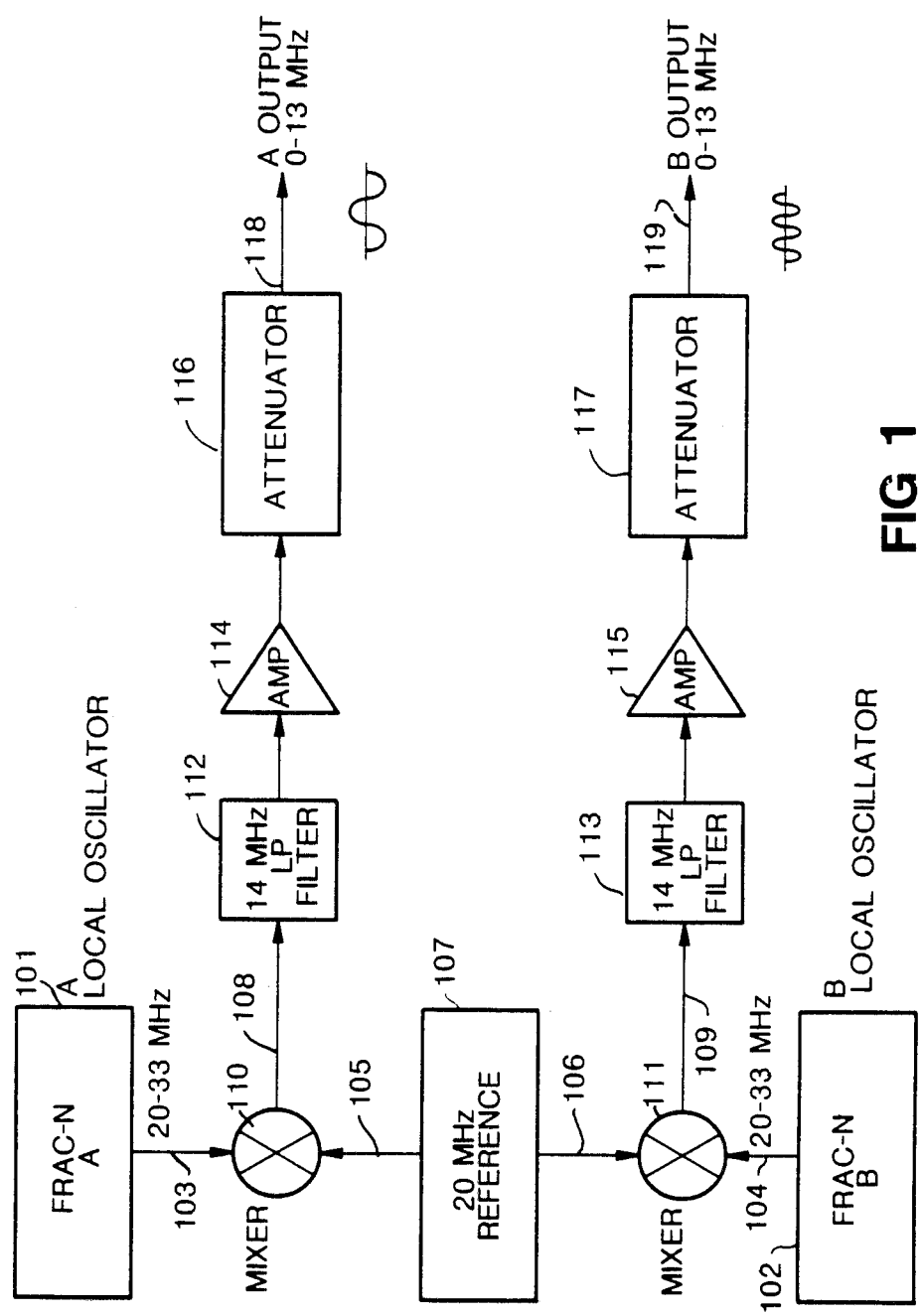
FIG. 1 is a simplified system block diagram of a preferred embodiment of the present invention describing the signal synthesizer system in the two channel mode.

In FIG. 1, a signal synthesizer system is shown as a system configuration. In the embodiment of the invention, the signal synthesizer system in two channel mode is configured as two independent synthesizers which are sharing a common frequency reference and controller. Namely, each channel A or B has a fractional-N based local oscillator 101 or 102 which is tunable from 20 to 33 MHz with microhertz resolution. Fractional-N based oscillators are well known in the art and are disclosed in U.S. Pat. No. 3,928,813 entitled "Device for Synthesizing Frequencies Which Are Rational Multiples of a Fundamental Frequency" issued on Dec. 23, 1975 to Charles A. Kingsford-Smith and assigned to the instant assignee. The respective local oscillator signals 103 and 104 are mixed with fixed 20 MHz signals 105 and 106 from a common frequency reference 107 to obtain the desired 0 to 13 MHz signals 108 and 109 by mixers 110 and 111. The mixer outputs 108 and 109 are respectively low pass filtered to reject the high frequency images 14 MHz and above by low pass filters 112 and 113, and then amplified by amplifiers 114 and 115. Step attenuators 116 and 117 are used to provide 80 dB dynamic range of output levels. Hence, output signals 118 and 119 are respectively independent to provide variable frequency, spectrally pure signals from 0 to 13 MHz with sufficient gains as two separate synthesizers.

Figure 2:
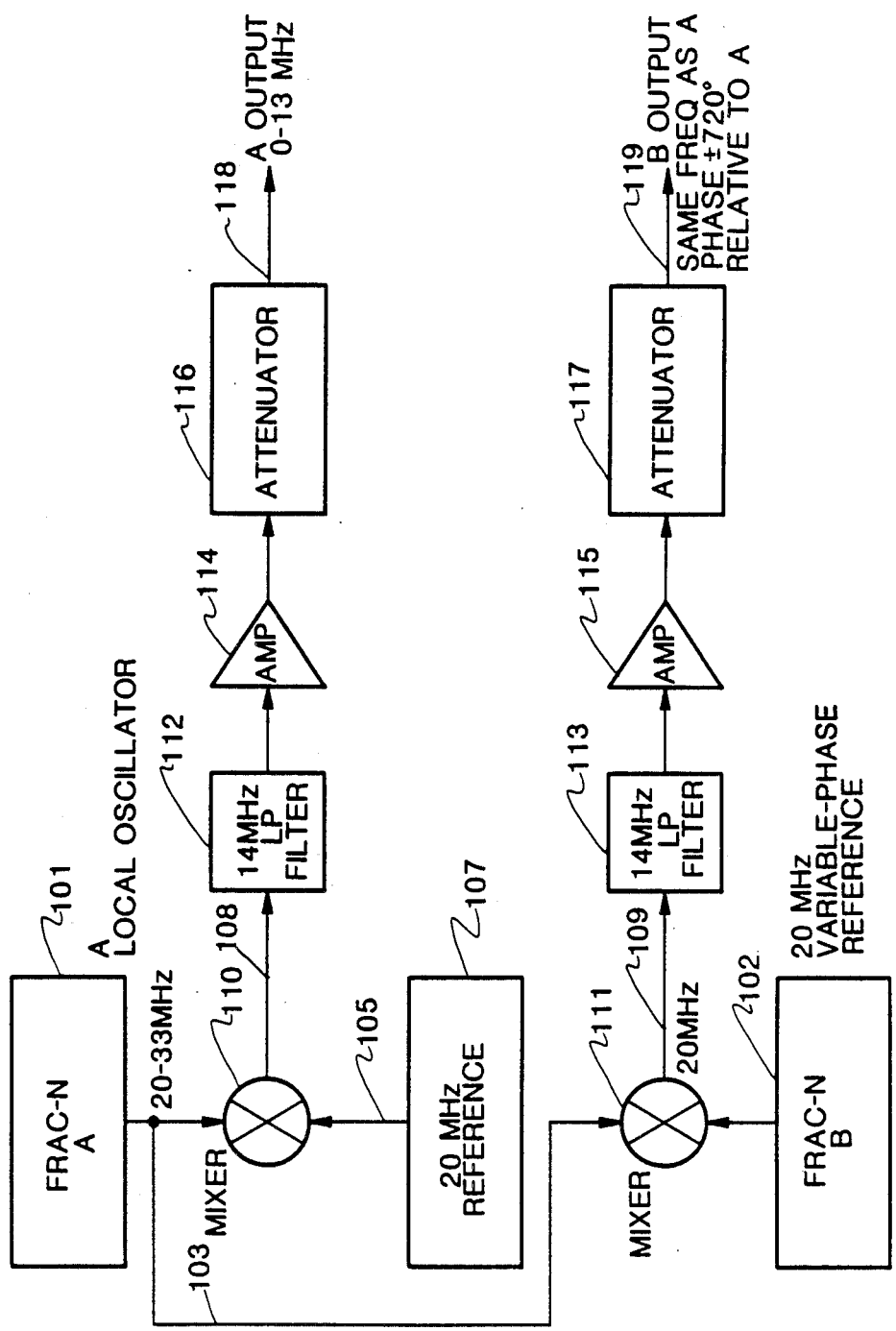
FIG. 2 is a simplified system block diagram of the embodiment describing the signal synthesizer system in the two phase mode.

In FIG. 2, the signal synthesizer system in two phase mode is also shown as a system configuration. The A channel consists of the local oscillator 101, the frequency reference 107, the mixer 10, the low pass filter 112, the amplifier 114, and the attenuator 116 is configured exactly as in two channel mode shown in FIG. 1. However, for the B channel, the reference 107 and the local oscillator signal 103 are switched before the mixer 111 by a common controller such that the A fractional-N base local oscillator is the local oscillator for the B channel as well, and the B fractional-N base local oscillator is set to 20 MHz and is used as a reference whose phase can be precisely changed relative to the fixed reference 107. The fixed reference 107 is used for the A channel. This results in signals 118 and 119 at the outputs which have the same frequency with relative phase between B and A being settable to 0.01 degree resolution. As the A channel changes in frequency, the relative phase between B and A remains constant. Hence, the frequency can be the same for the output signals 118 and 119 with a variable phase offset of the B output signal 119 with respect to the A output signal 118. This leads the system to one of the particular contribution that the use of B oscillator 101 as a variable phase reference allows phase between the two channels A and B to be constant over frequency with good stability between calibration periods. This includes phase continuity through sweep.

Figure 3:
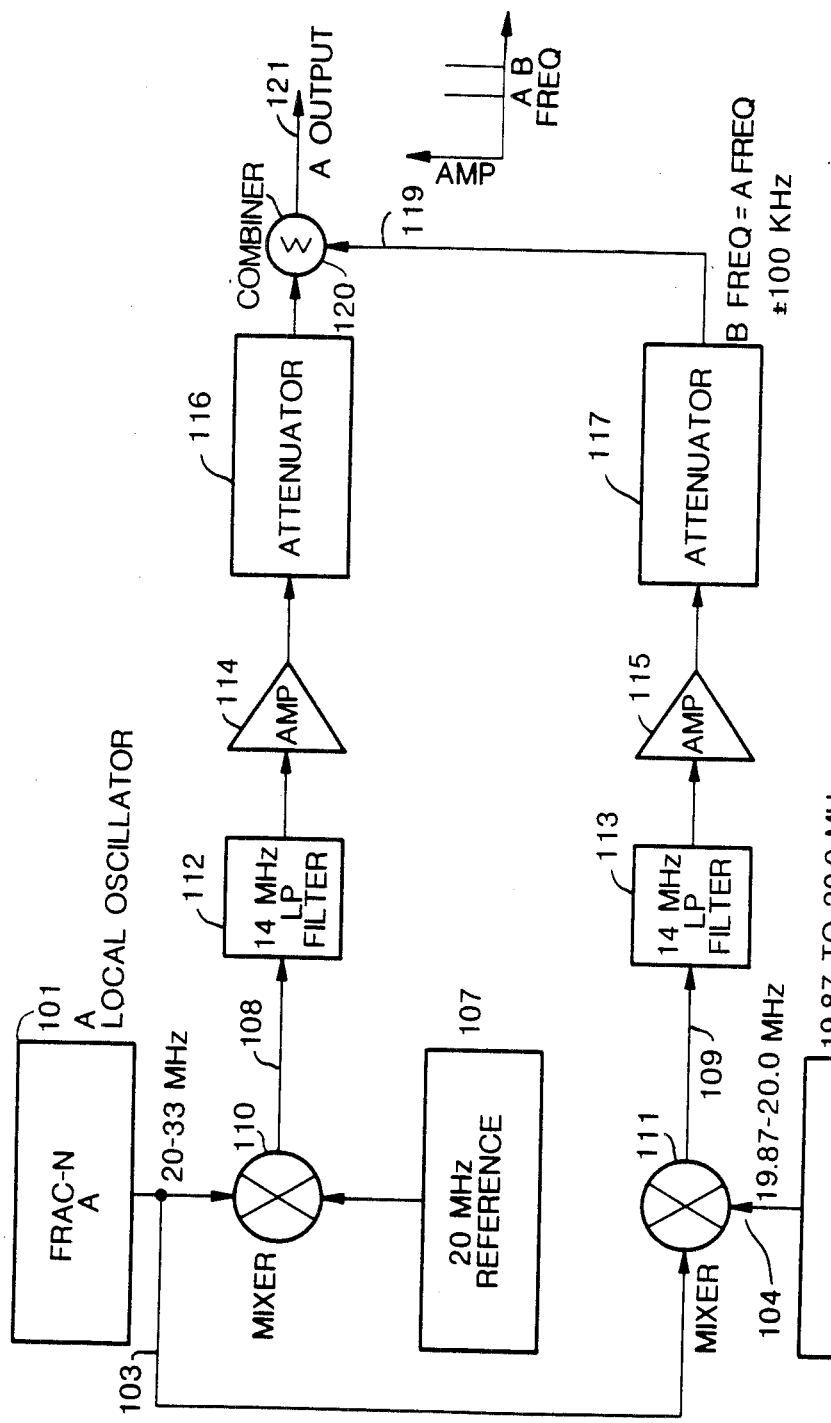
FIG. 3 is a simplified system block diagram of the embodiment describing the signal synthesizer system in the two tone mode.

In FIG. 3, the signal synthesizer system in two tone mode is also shown as a system configuration. The local oscillator and reference switching is identical to the two phase mode shown in FIG. 2. Again, the B fractional-N base local oscillator 102 is used as a reference for the B channel. But, instead of changing the phase of the B local oscillator 102, the B local oscillator 102 is set to a frequency at 20 MHz plus some offset which is less than 100 KHz. This results in signals at the outputs 118 and 119 of the channels A and B which are offset in frequency by up to 100 KHz. An important benefit of this configuration is that as the A channel changes in frequency, the B channel automatically tracks while maintaining the precise frequency offset relative to the A channel. The channels A and B can be combined on single output 121 by a combiner 120. Hence, different output frequencies are available from each channel. This leads the system to an another particular contribution that the use of the B oscillator 102 as a variable frequency reference allows the B channel frequency to maintain a precise frequency offset from the A channel with minimal phase noise between the channels A and B. Also this precision offset is maintained during a sweep of the A channel.

Figure 4:
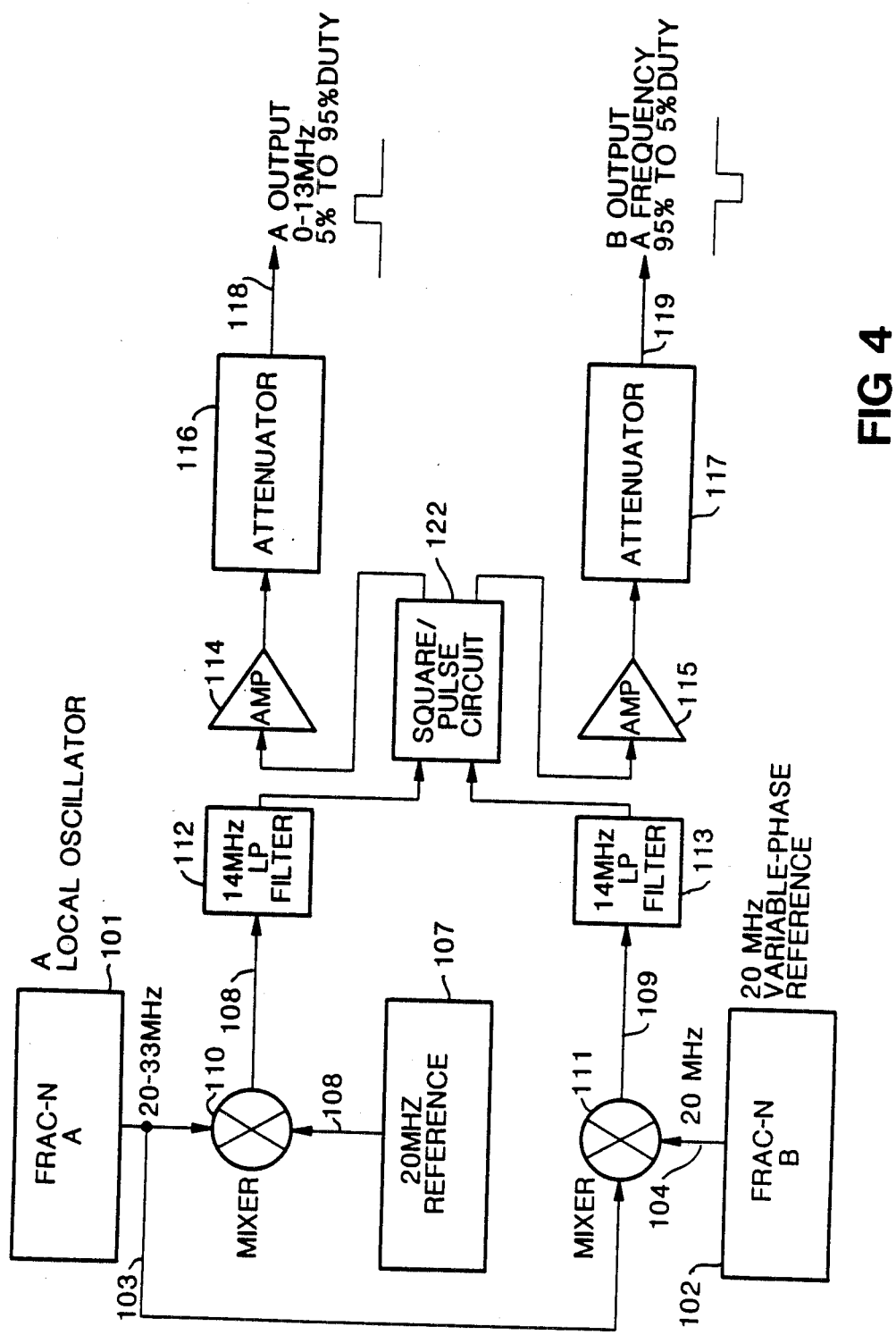
FIG. 4 is a simplified system block diagram of the embodiment describing the signal synthesizer system in the pulse mode.

In FIG. 4 the signal synthesizer system in pulse mode is also shown as a system configuration. The local oscillators 101 and 102, and the frequency reference 107 are switched exactly as in the two phase mode as shown in FIG. 2 by the common controller. The distinction in FIG. 4 is that before the output amplifiers 114 and 115, the sinewave signals 108 and 109 low pass filtered by the filters 112 and 113 are switched to a square/pulse circuit 122 which squares up and combines the signals in such a fashion as to yield a pulse waveform. The duty cycle reflects the phase difference between the A and B channels. The duty cycle is adjustable from 5% to 95%. This waveform is output on the A channel. For convenience, the complement of this waveform is available on the B channel. Hence, the signal outputs 118 and 119 are variable duty cycle square waves and are complementary to each other.

Figure 5:
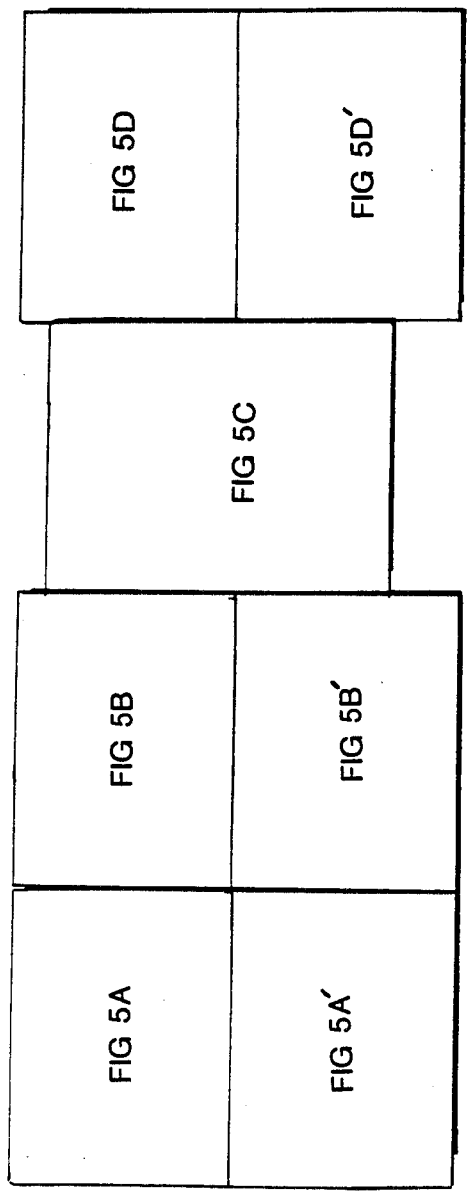
FIGS. 5-5D' are a detailed schematic diagram of the embodiment describing the detailed system configuration of the signal synthesizer system.
Figure 5A:
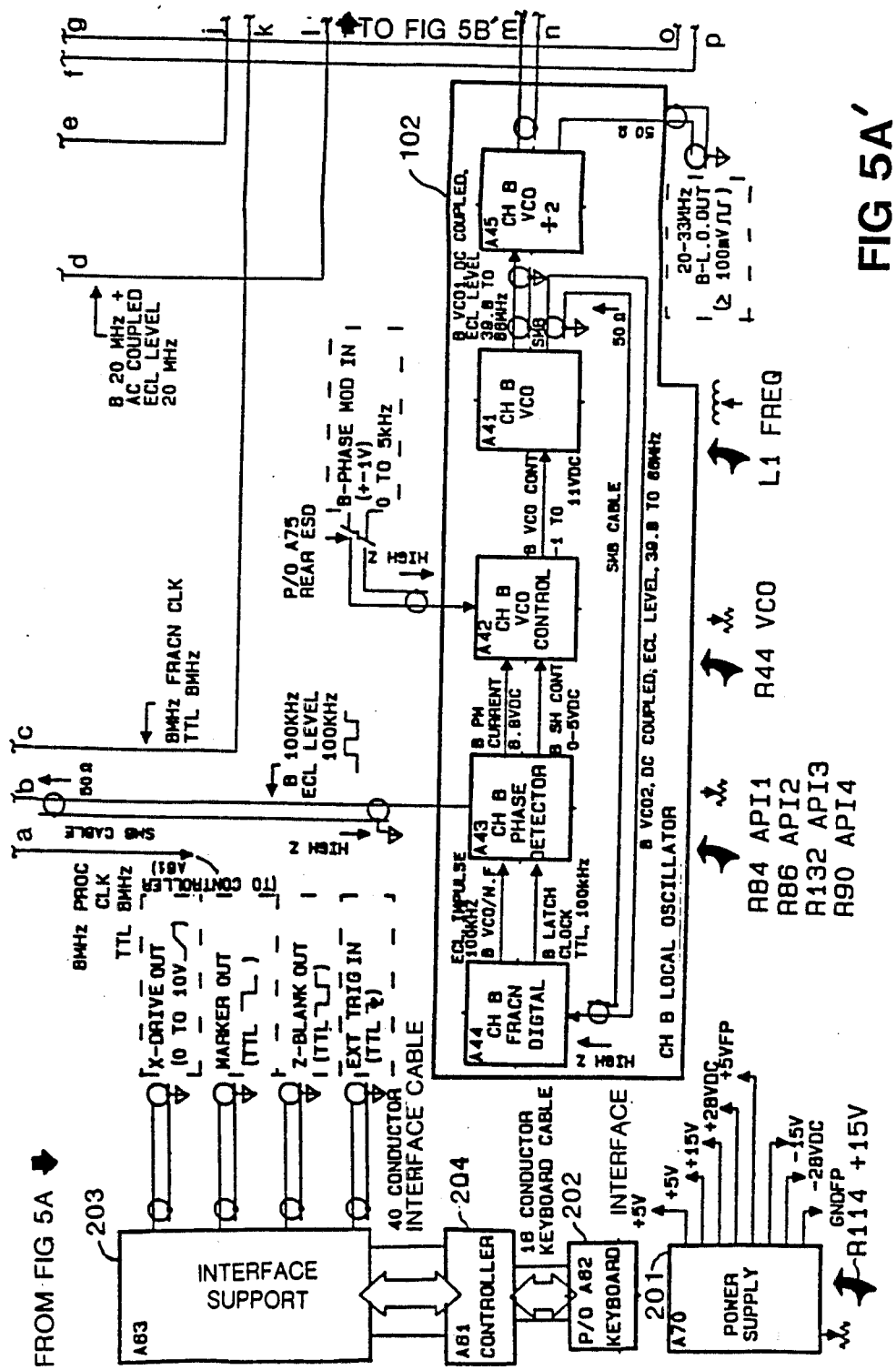
Figure 5B:
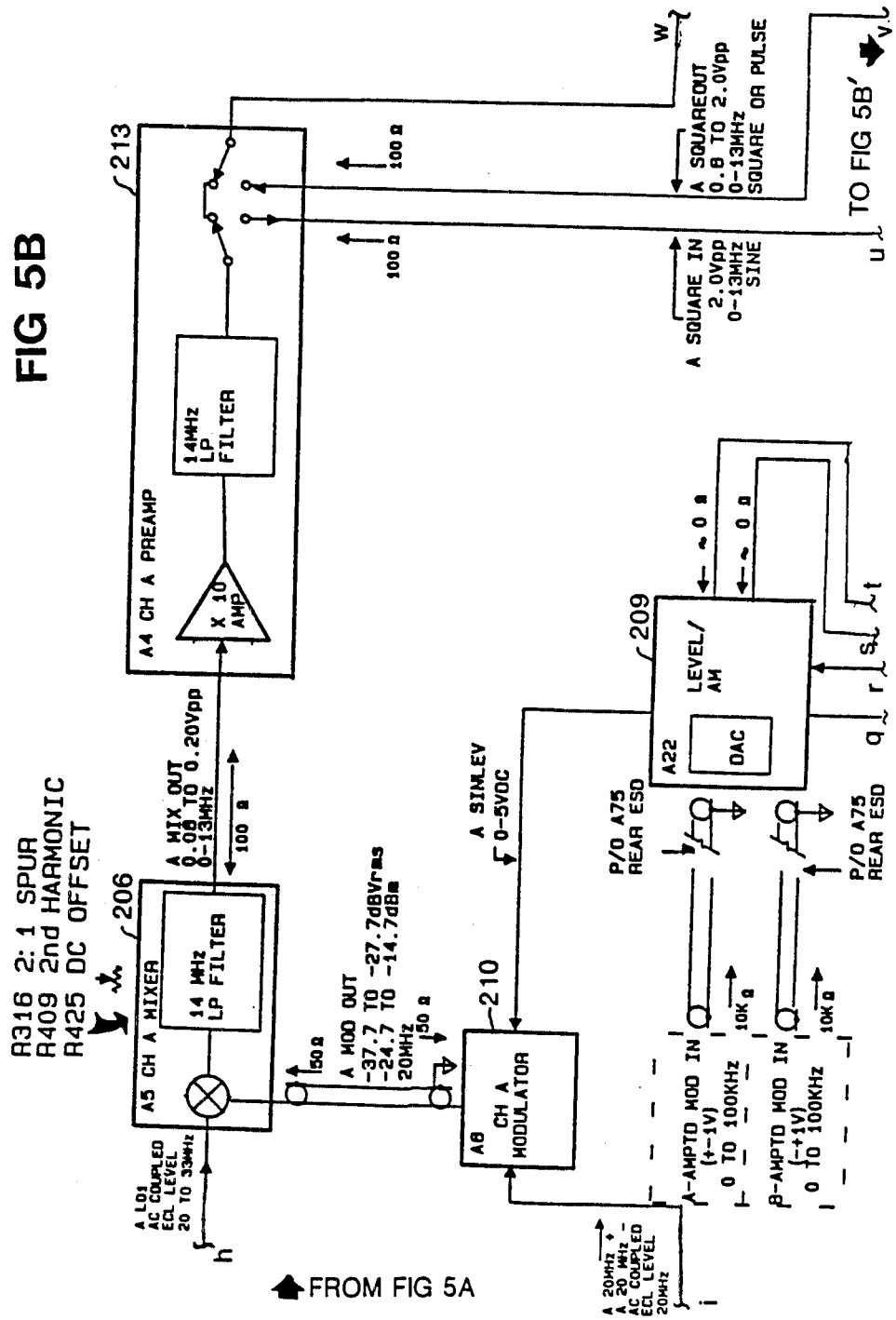
Figure 5C:
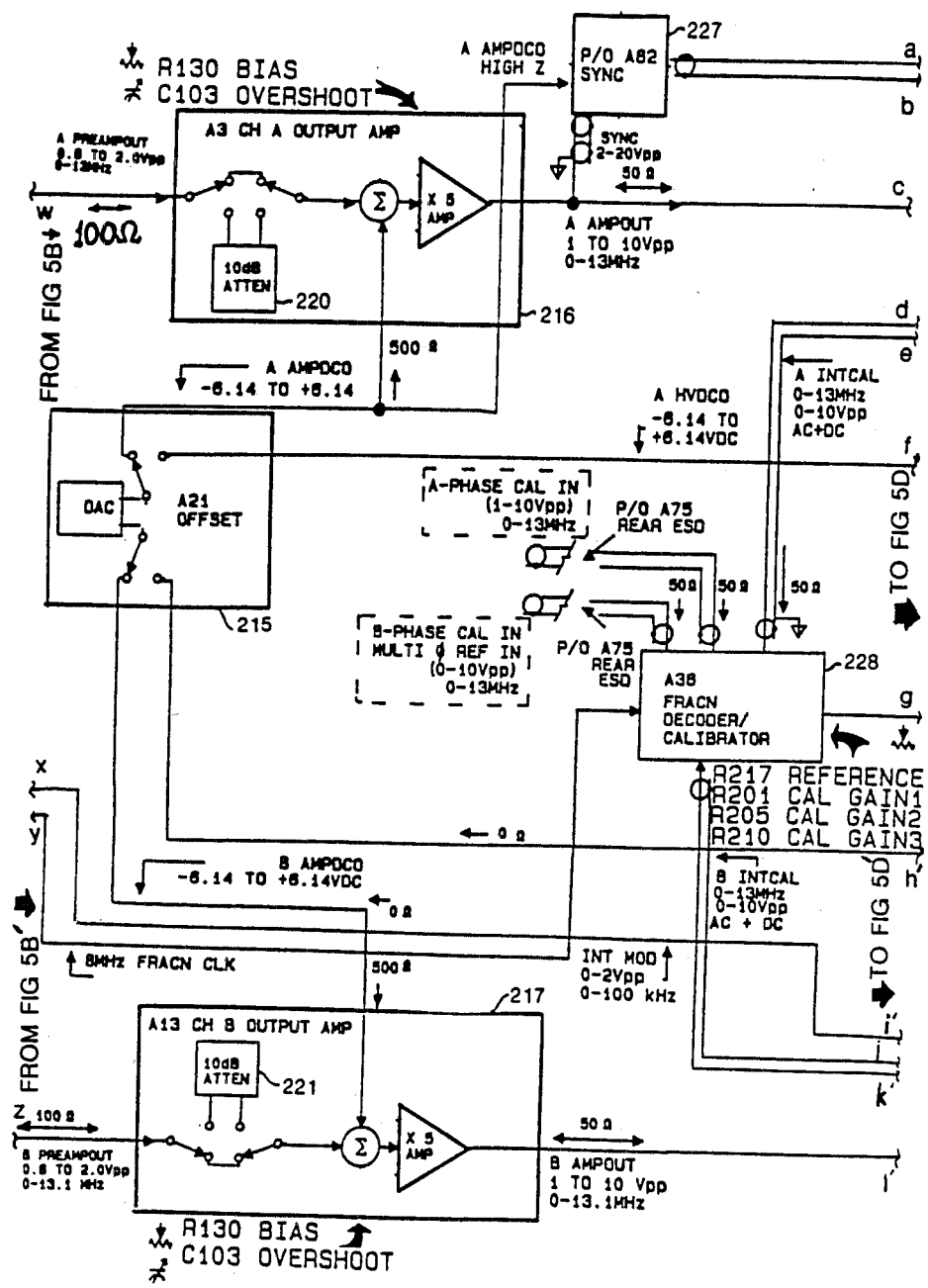
Figure 5D:
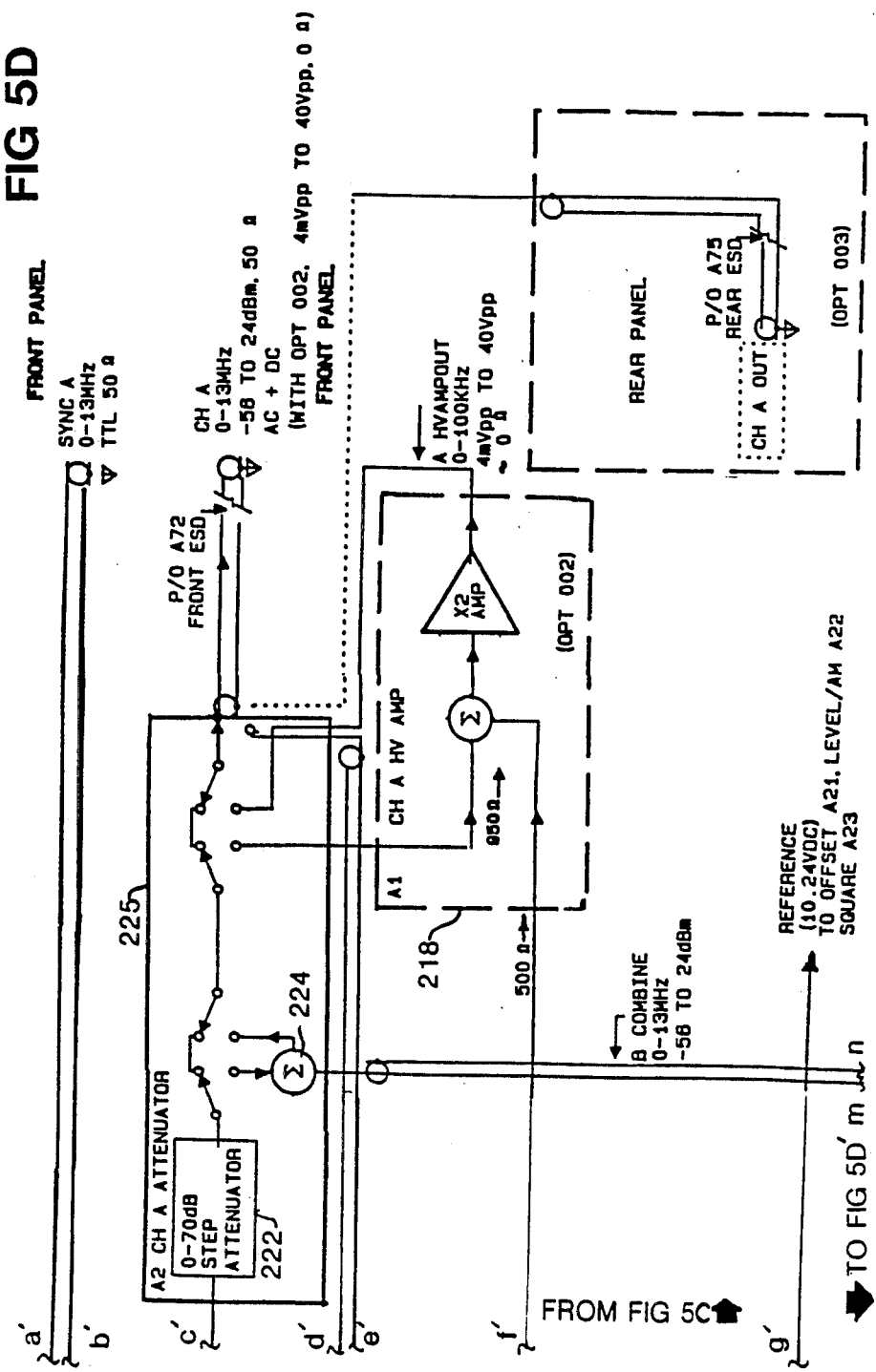

In FIGS. 5-5D', detailed design of the simplified system block diagram of the embodiment in FIG. 1 through FIG. 4 is disclosed as a detailed schematic diagram.

Hereinafter, further features and modifications of the embodiment of the invention will be explained in regard to capabilities of sweep, functions, amplitude control, DC offset, modulation, combiner, calibration, oven reference, and high voltage option.

In all mode configurations, the sweep capability of the fractional-N oscillators can be used. Arbitrary start and stop frequencies and sweep times can be specified. Sweeps are phasecontinuous. Means are provided for starting the sweep from an external trigger with minimum delay.

Either square waves or sinewaves may be selected on each channel. The edges on the square wave coincide with the zero crossings of the sinewave. By suppressing AC, the outputs can be configured to generate only the DC offset level. Also, either of the outputs can be turned off entirely via a relay. Regardless of the function selected, a nominal 50 ohm source impedance is seen, unless the high voltage option is enabled in which case a low impedance which is less than 2 ohms is seen.

Amplitude can be controlled over a range from +23.97 dBm into 50 ohms, which is 10 volts peak to peak, to −56 dBm, which is 1 millivolt peak to peak. The combination of a selectable 10 dB attenuator before the output amplifier and a 0 dB to 70 dB step attenuator following the output amplifier allows the amplitude to be changed in 10 dB increments. The fine adjustment between 10 dB increments is provided by modulating the level of the 20 MHz reference signal before it gets into each mixer.

A DC offset can be added on top of the AC signal from each channel. Normally, this offset is injected before the output amplifier, so its maximum level is determined by the level of the AC signal. The instantaneous maximum level of DC plus AC cannot exceed the ±5 volt limits of the output amplifier. Also, the DC signal is attenuated right along with the AC as it passes through the output attenuator. If the high voltage option is selected, the DC offset is injected right at the high voltage amplifier so a large DC offset can be obtained, even if the AC signal level is highly attenuated.

The B channel output may be switched internally to become the level control for the A channel reference, thus allowing internal amplitude modulation on the A channel, or it can be switched into the phase control circuit of the A channel fractional-N oscillator, allowing internal phase modulation of the A channel. While internal modulation is enabled, the B channel output is disabled. Similarly, either channel A or B can be amplitude modulated, phase modulated, or both simultaneously from separate external inputs.

The outputs of the A and B channels can be as combined together into one output by enabling the internal combiner 120 as explained in FIG. 3. Since this is a broad-band resistive combiner, the level of each signal drops to one-half.

The outputs of both channels A and B can be switched onto the calibrator circuit which is able to measure the amplitudes of either channel and relative phase between the two. Measurements taken are interpreted by the controller which in turn adjusts the level control or the fractional-N phase to correct for any error. During calibration, the signals are switched off at the outputs of the instrument. An alternate configuration provided is to measure the signals present on the rear panel "external cal" inputs. This allows "remote sensing" for phase cal which lets the user eliminate the effects of loss and phase shift in his cabling to the device under test. During either internal and external cal, the calibrator always measures phase of the "B" signal relative to "A" signal. The embodiment of this calibration system will be more precisely explained hereafter.

An oven-stabilized 10 MHz frequency reference option can be installed in the instrument. The output of the oven goes directly to the rear panel and must be jumped across to the "external reference" input when it is used.

An optional high voltage amplifier can be added to each channel. This amplifier following the attenuator gives four times the normal 50 ohm terminated level which is two times the normal open circuit level over a 0 Hz to 130 KHz range. The low impedance output of the high voltage amplifier is seen directly without any series backmatching resistance.

If the high voltage option is engaged, the DC offset is injected into the input of the high voltage amplifier instead of before the output amplifier. This allows a large DC offset to be provided with a small AC signal which has come through the output attenuator.

In referring to FIG. 1 through FIG. 5, the embodiment of the invention will be more fully described hereinafter as regards how the signal synthesizer system works.

As to power supplies and grounding, a linear power supply 201 having seven separate outputs is provided as shown in FIG. 5A'. Plus and minus fifteen volt supplies are used throughout the instrument. In addition, three separate five volt supplies are available. The main five volt supply is a highly regulated and very clean supply. It is used by most of the circuit assemblies wherever the demand is fairly constant or special isolation is not required. A separate five volt supply is necessary for the keyboard assembly 202 to keep the display scan frequency components out of the main five volt supply. The third five volt supply is used to power the interface support circuitry 203 which is IEEE standard 488 interface. Finally, a +28 and −28 supply provide power for the high voltage option.

Two separate grounds are maintained. The instrument enclosure is, of course, tied to earth ground via the line cord. The interface 203 ground is tied to the enclosure at a single point very close to the interface connector. To prevent low frequency ground loop problems and provide isolation, the instrument ground is separate from earth ground. This includes all of the internal card nests, motherboard, cables, etc. RF paths are provided from instrument ground to earth ground via multiple capacitors and a varistor ensures that no more than 50 volts potential appears between the two grounds.

As to the controller 204, all functions of the instrument are controlled by the 6809 microprocessor on the controller board 204, operating from 56 Kbytes of ROM. The controller 204 accepts commands in the form of keyboard entry or via the interface and controls each of the hardware assemblies via the instrument bus. The instrument bus is buffered and disabled any time that instructions are not actually being written to hardware to keep processor clock frequency from coupling to sensitive circuits.

Various hardware status lines and external synchronizing signals are monitored or set by the controller 204.

As to keyboard 202, the keyboard assembly 202 includes all switches and lights to interface with the operator. This includes 43 pushbutton switches, one rotary pulse generator (RPG), 49 individual LED's, 11 seven-segment digit displays, and 1 four-character alphanumeric display. The keyboard 202 is interfaced to the controller 204 via a bit-serial interface.

In addition, the keyboard 202 holds the synchronous circuit to keep it isolated from the clean output signals.

As to oven reference 205, option 1 provides for an oven-stabilized crystal reference 205 which is mounted below the power supply in the rear of the instrument 205. The output goes directly to the rear panel. To use the reference 205, it must be externally connected to the external reference input on the rear panel.

As to reference 107, the reference board generates all frequency references and clocks for the instrument. These include:
* Two 20 MHz reference signals which feed the "reference" ports of the channel A and B mixers 110 and 111.
* Two very clean 100 KHz clocks which provide the time base for the fractional-N circuitry of the two local oscillators.
* An 8 MHz clock for the controller board 204.
* A 10 MHz reference output available on the rear panel.

One input is available on the rear panel which accepts an external reference signal. If this signal is at a sub-harmonic of 10 MHz, the reference will synchronize with it.

As to local oscillators and switch, the A and B local oscillators 101 and 102 are identical fractional-N based synthesized oscillators. The five separate printed circuit assemblies make up each local oscillator (LO). In addition, there is a decoder circuit common to both local oscillators which reside on the calibrator board.

Each fractional-N oscillator is controllable via the instrument bus over a frequency range of 19.9 MHz to 33.0 MHz with one microhertz resolution. Both fractional-N osillator can be adjusted for phase by incrementing or decrementing in as little as 0.001 degree steps. The fractional-N circuits do not remember where they have been programmed in the past, so any absolute phase reference must be remembered in the controller memory after performing a phase calibration by using the calibrator assembly.

Either fractional-N oscillator can be swept over any frequency in the 19.9 to 33.0 MHz range, either up or down, maintaining phase continuity during the sweep. Start and stop frequencies are settable to one microhertz resolution. During sweep, a "sweep limit flag" is available which signals when the fractional-N oscillator has passed a pre-programmed frequency within the frequency limits of the sweep. There are two separately buffered ECL level outputs on each LO. One output from the A LO 101 is permanently input to the A mixer LO port 206. The other A LO signal is input to the RF switch 207 where it is switched onto the B mixer LO port 208 for all operating modes other than two-channel.

One B LO signals goes to the RF switch 207 where it is switched onto either the LO port of the B mixer 208 in case of the two channel mode, or onto the reference port of the B mixer 208 in case of the other three modes. The second B LO signal is made available as a 20 to 33 MHz output on the rear panel.

As to level/AM control 209, the level/AM control assembly provides an audio frequency signal which either drives the A or B modulator 210 or 211 for sine operation, or drives the square wave circuit 212 for square or pulse operation. If no amplitude modulation signal is present, the output is a DC voltage proportional to the digital to analog converter (DAC) setting programmed by the controller 204. Separate digital to analog converters are provided for each of the two level outputs. If a modulation signal is present, either internally from the channel B output, or externally from the rear panel inputs, the level outputs are proportional to both the DAC setting and the level of the modulating signal, subject to the 150 KHz bandwidth limit of the level control.

Programmable switches are provided to allow the controller 204 to specify either internal or external modulation for each level control, and to direct the output of each level control to either the sinewave modulator 210 or 211 or square wave circuit 212 of the respective A and B channels.

As to modulator, the modulator circuits 210 and 211 for each channel controls the level of the reference signal to the respective mixers 206 and 208 over a ten decibel range, thus controlling the level of the output signals from the instrument. Inputs to the A modulator 210 are the 20 MHz reference from the reference board 107 and the A level control signal from the level/AM board 209. The resulting level-controlled reference is band-pass filtered to eliminate harmonics of 20 MHz and limit noise outside a ±100 KHz bandwidth around 20 MHz. The resulting "AMPOUT" output is input to the A mixer 206.

The B modulator 211 operates in exactly the same fashion, except its 20 MHz input comes from the RF switch circuit 207.

As to mixers 206 and 208, the A and B channels use identical double-balanced, active mixers to heterodyne the 20 to 33 MHz (nominal) LO signal with the 20 MHz (nominal) reference signal to generate suppressed-reference double side-band products. The high sideband (40 to 53 MHz) as well as the residual 20 MHz reference signals are filtered out, yielding a "pure" signal of interest between 0 and 13 MHz with all other spurious and harmonic signals suppressed. The lowpass filter is split between the mixer board and the pre-amp to minimize the effect of interference along the interconnect path.

The active mixer design is optimized for low spurious and harmonic distortion.

As to pre-amp, the pre-amplifier circuit 213 or 214 contains the latter half of the first low-pass filter for each channel.

After filtering, the signal is amplified by a fixed gain (X10) amplifier; then it goes through an additional low pass filter before being passed on.

The output of the pre-amp is directed either directly to the output amplifier input, or to the square wave circuit using a controller programmed relay.

As to square circuit, the square wave circuit 212 has two functions. First, with the square wave function selected for either channel, that channel's signal is directed through the square circuit, which generates a crisp square wave output whose edges match the zero-crossings of the output of the pre-amp and whose amplitude is controlled by the level control from the level-/AM circuit 209. Either A or B or both may have square function selected.

Secondly, in the pulse mode, the A output of the square wave circuit is a pulse waveforms whose pulse width reflects the phase difference between the A and B pre-amp outputs. The B output of the square circuit 212 is the logical complement of the A waveform.

As to offset control, the offset control circuit 215 generates a separate DC offset for each channel as determined by DAC's under processor control. Under normal operation, the offset signal is injected into the output amplifier summing node. If the high voltage option is enabled, the signal is injected into the summing node of the high voltage amplifier 218 or 219. A relay on the offset board directs it to one node or the other. Both channels have identical offset operation.

As to output amplifier, the output amplifier 216 or 217 boost the signal to its maximum level of up to ±5 volts into 50 ohms (±10 volts open circuit).

The AC circuit path from the pre-amplifier 213 or 214 can be switched through a 10 dB attenuator 220 or 221. In most operating modes, this 10 dB pad is the first pad thrown in as amplitude is reduced. The benefits of having this first 10 dB before the amplifier include:
* Improved harmonic distortion on ranges 2 through 8, since output amplifier is driven at a much reduced level.
* Guaranteed DC offset for ranges 2 through 8. Since offset is injected after the 10 dB pad, headroom remains in the output amplifier 216 or 217 to provide substantial DC offset regardless of the AC level of the output.

* Phase calibration is improved by allowing the calibration level sensitivity and modulator phase as a function of level to be characterized in the calibration process.

The signal goes through an overload current sense circuit, and a 50 ohm backmatch resistor.

As to attenuator, the step attenuator 222 or 223 allows the amplitude of the output signal to be attenuated in 10 dB steps to as much as 70 dB, maintaining 50 ohm impedance throughout.

In addition to the attenuator 222 or 223, this printed circuit board contains additional overload sensing and a cutout relay for the overloads.

Also, a relay is provided to divert the signal from the attenuator input to the calibrator board.

Another relay re-directs the signal out of the attenuator 222 or 223 through the high voltage amplifier and back, when the option is selected.

Finally, if the combiner is engaged, both the A and B signals are input to a summing network 224 on the A attenuator 225. The combined signal is output on the A channel, and the B output is terminated with 50 ohms to ground. The presence of this network on A is the only distinction between the A and B attenuator circuits 225 and 226.

As to synchronous circuit (SYNC) 227, a small circuit which resides on the keyboard assembly taps off the output signal from the output amplifier 216 and generates a square wave whose edges are coincident with the zero-crossings of the waveform out of the amplifier. Because there may be some DC offset programmed, the SYNC circuit 227 also requires a sample of the DC offset level to correct for this. The SYNC circuit 227 is available directly on the front panel after going through some protective circuitry. As to calibration, the final block in the instrument signal chain is the calibration 228 which is capable of measuring DC offset, and peak-to-peak amplitude on both A and B channels and can measure phase between the channels very precisely.

Under control of the controller board 204, the calibrator takes data points, swapping back and forth between channels and alternately engaging or disengaging the 10 dB pad 220 or 221 on the output amplifier 216 or 217 while changing the levels of the modulators 210 and 211. The combinations of measurements made allows most systematic errors to be corrected for yielding very precise phase comparison between A and B.

As measurements are taken, the controller 204 iteratively changes the amplitude or phase parameter being calibrated to minimize error. In phase calibration, the controller "bumps" the phase of the fractional-N oscillator. During amplitude calibration, the controller changes the DAC settings on the level control circuit. And, during offset calibration, the controller changes the DAC settings on the offset control.

Besides the "internal" calibration configuration, where B phase is adjusted relative to A phase by internally sampling the two signals, two other configurations can be selected.

In "external" calibration, the signals present at the two rear panel calibration inputs are assumed to be the A and B signals measured at the end of a cable, or after being modified by some device under test. The calibration process is the same as with internal calibration.

In "multiphase" calibration, the A calibration input is expected to be a signal from another source, and the B input is expected to be the A output of the system. In this configuration, the phase of A is bumped to align the A channel with the output of the other source. The other source must have its reference locked with the system in order to get a successful phase calibration.

As explained in a previous section, the phase calibration system has an unique contribution to the signal synthesizer system such that with two channels in one instrument and the addition of the phase calibrator, very precise phase accuracy can be maintained. This phase calibration technique allows theoretically zero phase error for equal level sines, and utilizes a unique attenuator switching technique to characterize and correct for phase errors introduced by the difference between levels in the two channels.

In referring to FIG. 6 through FIG. 12, the signal synthesizer system will be more fully described hereinafter as regards the phase calibration system.

Figure 6:
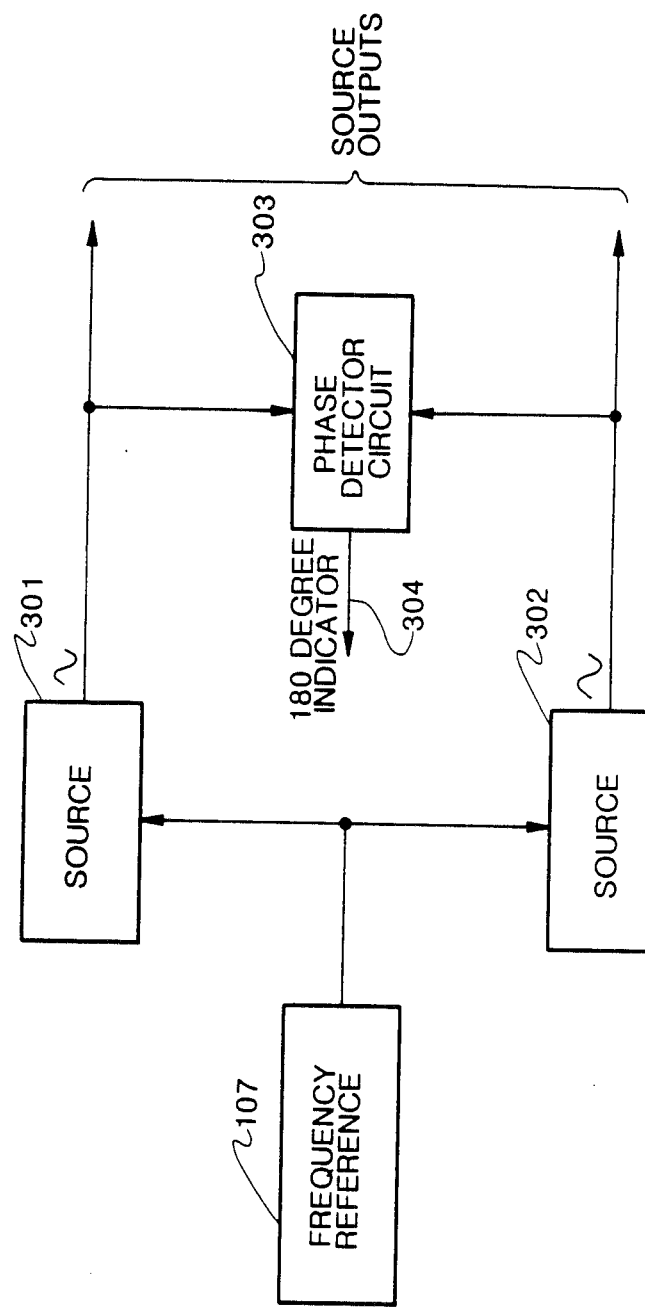
FIG. 6 is a simplified system block diagram of the embodiment describing basic phase calibration system of the signal synthesizer system.

In FIG. 6, the phase calibration system as a subsystem of the signal synthesizer system is shown in a basically simplified system block diagram. Namely, the frequency reference 107 is connected to two sources 301 and 302 which are already discussed hereinabove as the A and B channels in FIG. 1 through FIG. 5. The two sources 301 and 302 are programmable in frequency, amplitude, and phase, by the controller 204, and are phase locked to the frequency reference 107 as explained above. Both outputs of the sources 301 and 302 are fed to inputs of a phase detector circuit 303 which gives an indication of when the phase between its inputs is 180 degrees. This phase detector circuit 303 consists of the decoder/calibrator 228 shown in FIG. 5C. A basic calibration scheme of the phase detector circuit 303 is as follows. First, the sources 301 and 302 are set up for frequency in which both sources are identical, as well as for amplitude. Second, the phase of one source 301 and 302 is varied until the phase detector circuit 303 indicates 180 degrees by a signal 304. Third, this point is defined as a 180 phase, and the desired phase offset is entered onto the sources 301 and 302 by the controller 204. Therefore, it is assumed that the phase of the sources 301 and 302 can be incremented very accurately, so that an accurate calibration to zero degrees will provide calibrated outputs from zero to 360 degrees.

Figure 7:
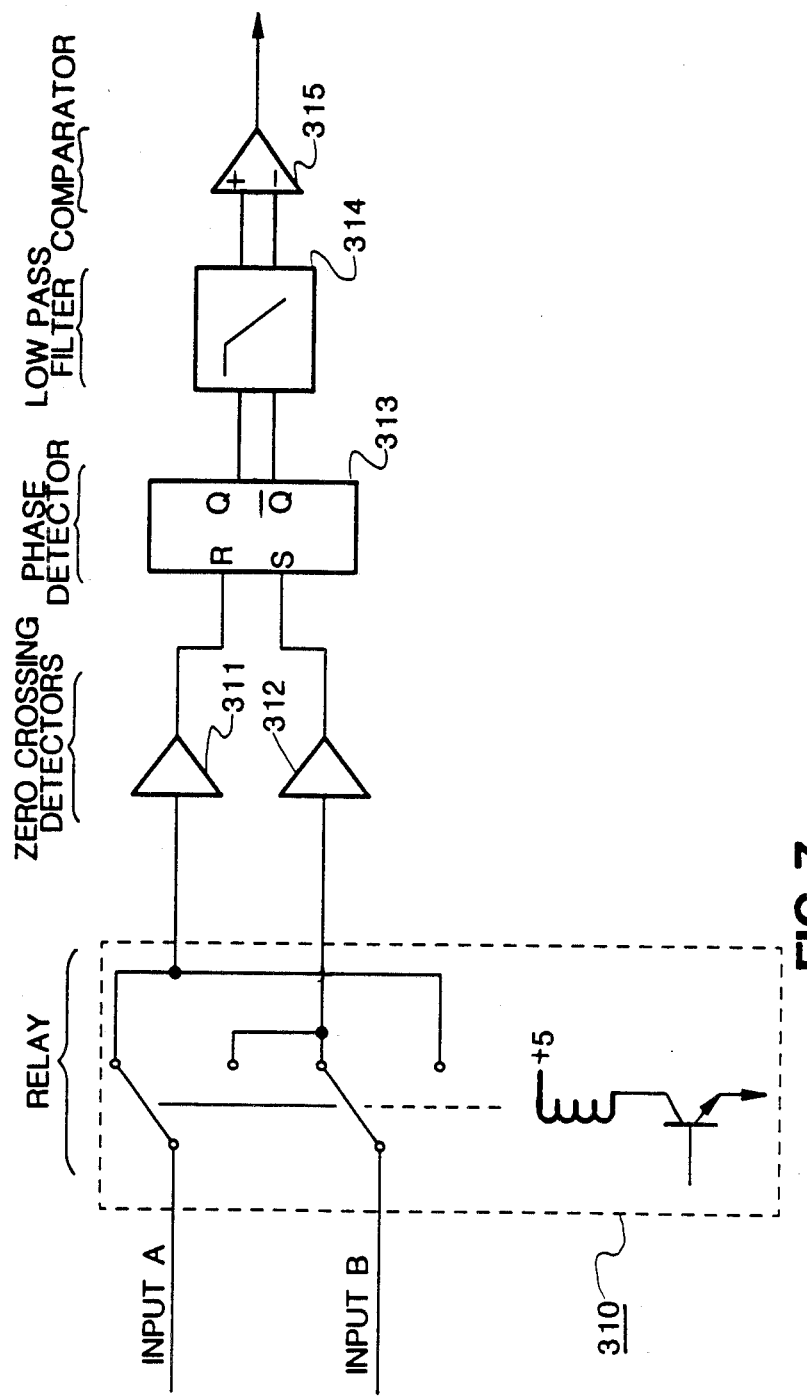
FIG. 7 is a block diagram of phase calibration system of the signal synthesizer system describing calibration operation.

In FIG. 7, the phase detector circuit 303 of FIG. 6 is described as a block diagram. The phase detector circuit 303 consists of five blocks which are a relay 310 to reverse inputs, two zero crossing detectors 311 and 312, a flip-flop phase detector 313, a low pass filter 314, and a comparator 315. Each function of this block diagram will be clearly explained in the following description.

Function of the zero crossing detector 311 or 312 is to take an analog waveform and convert it to a digital waveform, transitions of which reflect the timing of the analog zero crossings. The zero crossing detectors 311 and 312 are optimized for speed, insensitivity to amplitude and DC offset of the input signals, as well as noise rejection. It is preferable to use integrated circuit comparators as a choice of design for the zero crossing detectors 311 and 312 which require very high speed, high gain, and low offset voltage at a good price/performance ratio.

Figure 8:
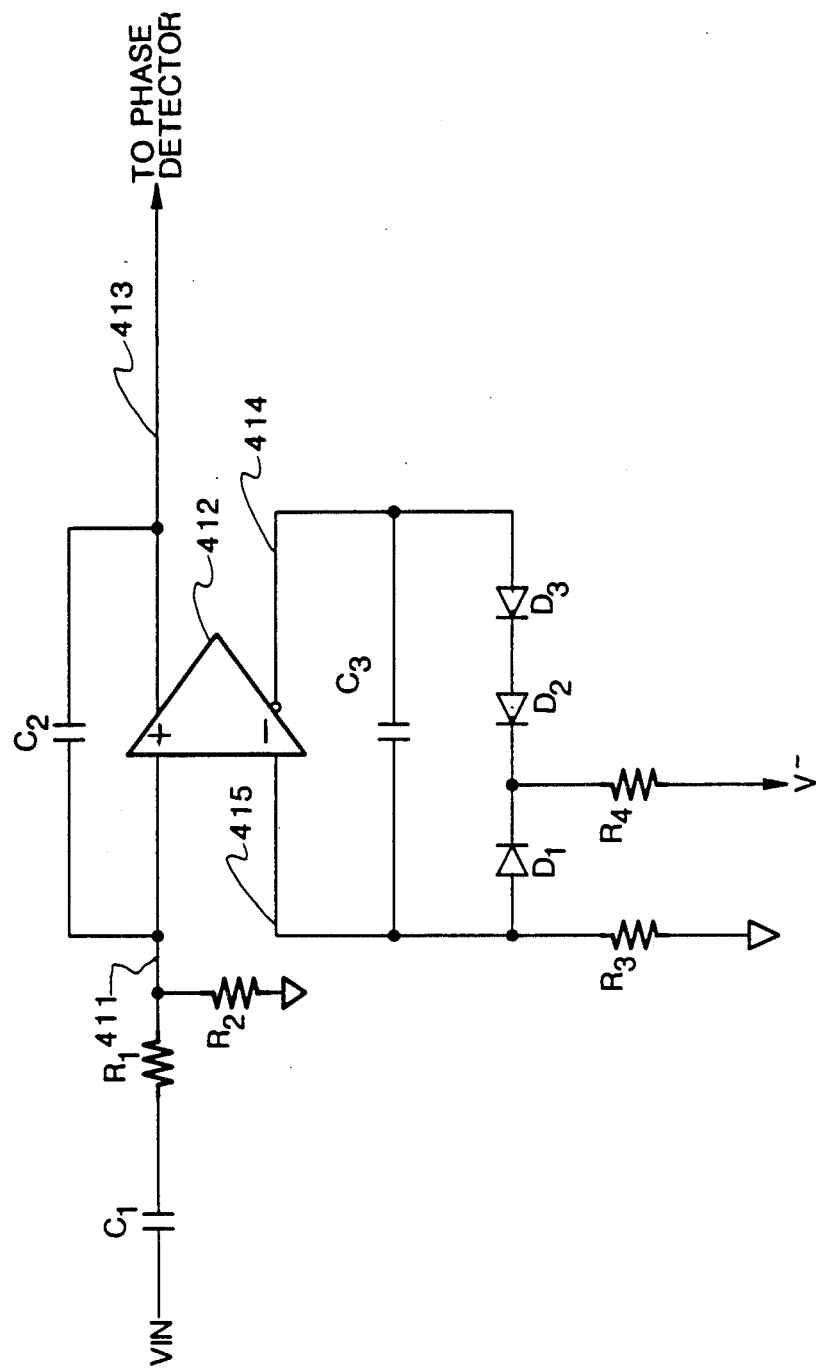
FIG. 8 is a circuit diagram of a zero crossing detector consisting of the phase calibration system shown in FIG. 7.

In FIG. 8, the zero crossing detectors 311 and 312 are precisely shown as a circuit diagram. The input signals Vin are capacitively coupled through a capacitor $C_1$, to reject DC components, resistively divided through resistors $R_1$ and $R_2$, and connected to a non-inverting input 411 of a comparator 412. Two feedback paths, which are AC and DC feedback, are connected from comparator outputs 413 and 414 to its inputs 411 and 415. The AC feedback is differential, and consists of capacitors $C_2$ and $C_3$. As the input signal 411 crosses the comparator threshhold, the outputs 413 and 414 change state, and couple a signal back to the inputs 411 and 415 in a regenerative manner. This positive feedback effect is very short lived, however, as an RC time constant at the inputs 411 and 415 is about one nanosecond. This allows high frequency circuit operation. The DC feedback path operates on the inverting input only, and consists of resistors $R_3$ and $R_4$, and diodes $D_1$, $D_2$ and $D_3$. When the input signal 411 is below the comparator threshhold, the inverting output 414 is high, which forward biases the diodes $D_2$ and $D_3$, and reverse biases the diode $D_1$. Therefore, the inverting input 415 will be at ground potential. This sets the switching threshold to zero volts for signals crossing in the positive direction. Once the input signal 411 is above this threshold, the inverting output 414 goes down, which turns off the diodes $D_2$ and $D_3$, and allows the diode 1 to become forward biased. The voltage at the inverting input 415 now is set by voltage division between the resistor $R_3$, the diode $D_1$, and the resistor $R_4$. This is then the threshold for signals crossing in the negative direction, which is designated to set to $-50$ mV.

The effect of this feedback is to implement hysteresis, which is necessary to allow the circuit to operate in the presence of noise. However, because the switching threshold for positive going signals is zero volts, the circuit still acts as a true (which means positive going) zero crossing detector. Timing of the comparator output transitions will then accurately reflect positive zero crossings, and show a small delay for negative zero crossings. The hysteresis is implemented in this manner because it is designed in order that the transition of importance on square or pulse waveforms is the rising edge, so that the circuit follows to react accurately these edges. The timing of negative zero crossings for both square and sine waves is not critical, because the flip-flop phase detector is clocked on rising edges only. The combination of AC and DC hysteresis gives this zero crossing detector the ability to accurately detect positive zero crossings, in the presence of noise, over a very broad frequency range.

Figure 9:
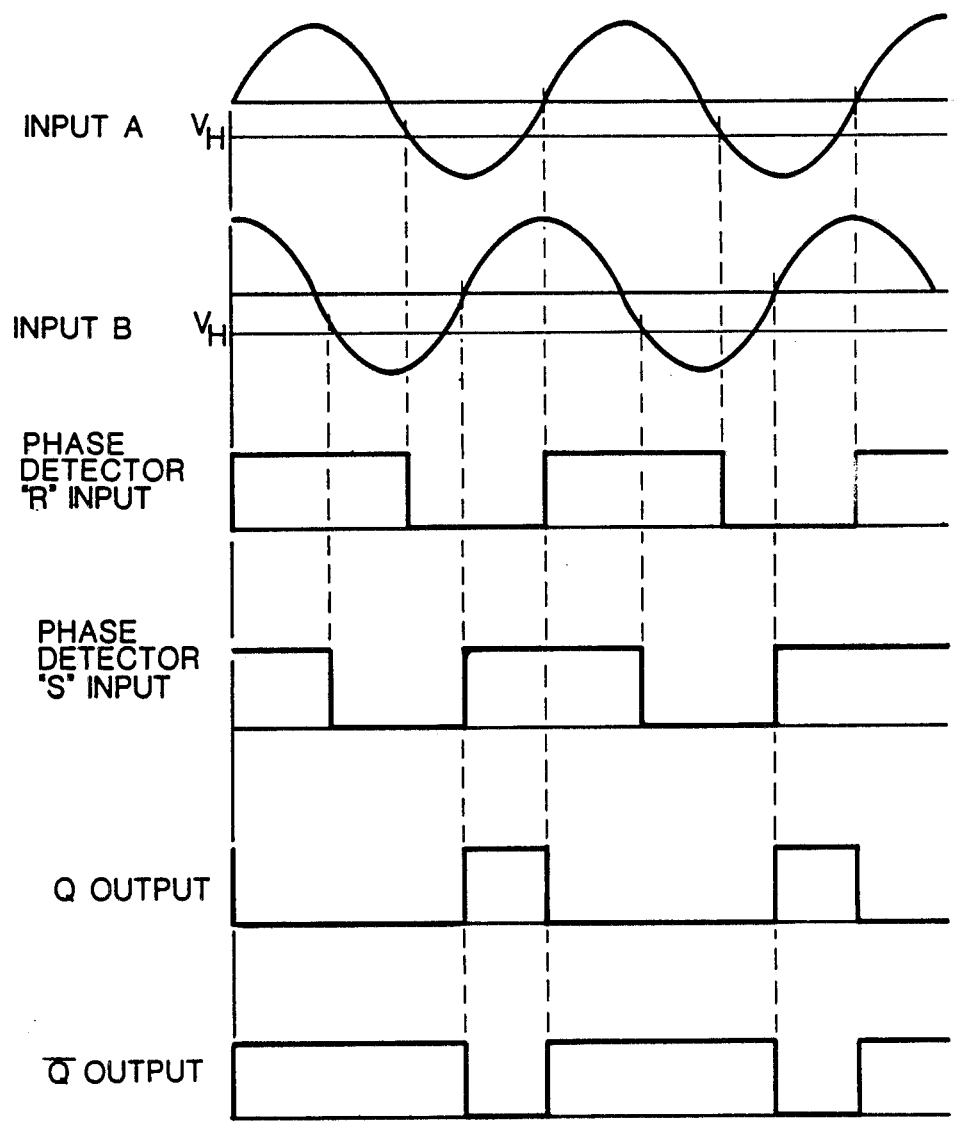
FIG. 9 is a timing chart of the phase calibration system shown in FIG. 7 to explain the relationship between input and output signals of the calibration system.

In referring to the timing chart of FIG. 9, the function of the phase detector 313 will be explained. Namely, two interconnected flip-flops form the phase detector 313, which is driven by the outputs of the two zero crossing detectors 311 and 312. An output $\overline{Q}$ and its complement Q of the phase detector 313 are both used by the following circuitry. One zero crossing detector 312 acts to set the phase detector 313, while the other zero crossing detector 311 acts to reset the phase detector 313. The outputs $\overline{Q}$ and $\overline{Q}$ of the phase detector 313 are then squarewaves whose duty cycle is determined by timing of the set and reset inputs S and R, which ultimately reflect the phase between the two original input signals A and B. An input phase difference of 180 degrees will produce a 50% duty cycle phase detector output. The timing chart shows these signals A and B for an arbitrary input phase; in this case the input B leads the input A by 90 degrees. A negative hysteresis voltage $V_H$ of the zerocrossing detector 311 or 312 is shown much exaggerated for the clarity of this discussion.

Figure 10A:
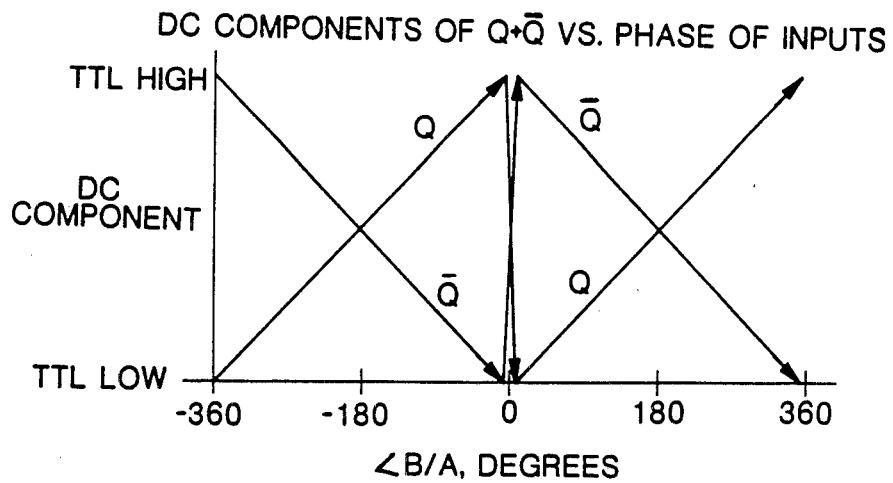
FIGS. 10A-10B are a transfer function diagram for the phase detector shown in FIG. 7 to explain the relationship between two input signals.
Figure 10B:
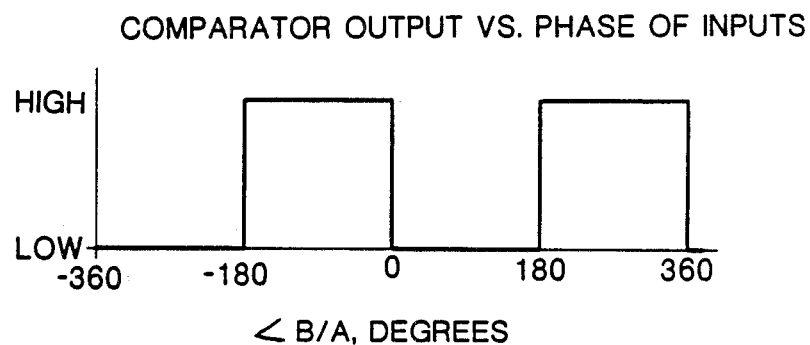
Figure 12B:
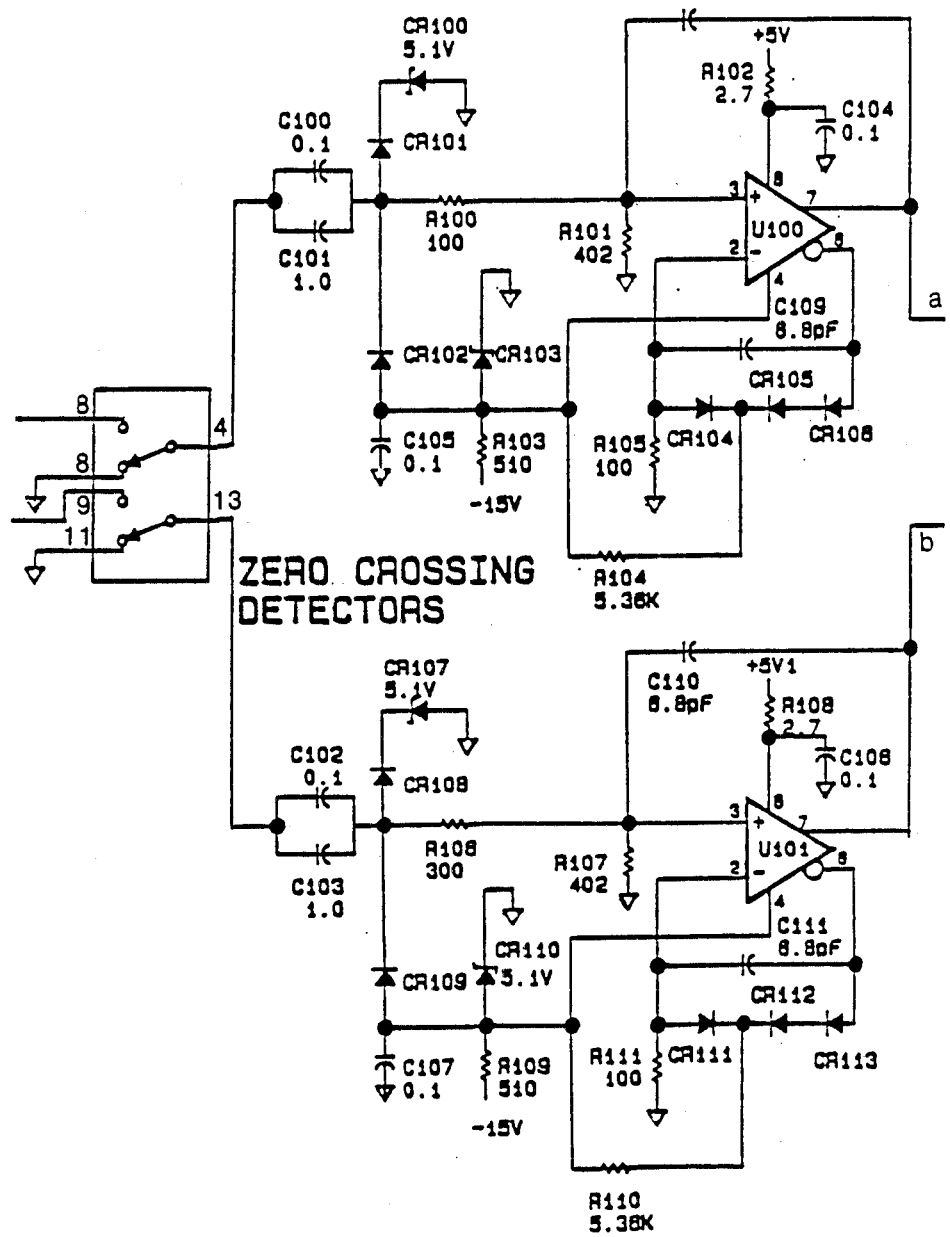
Figure 12C:
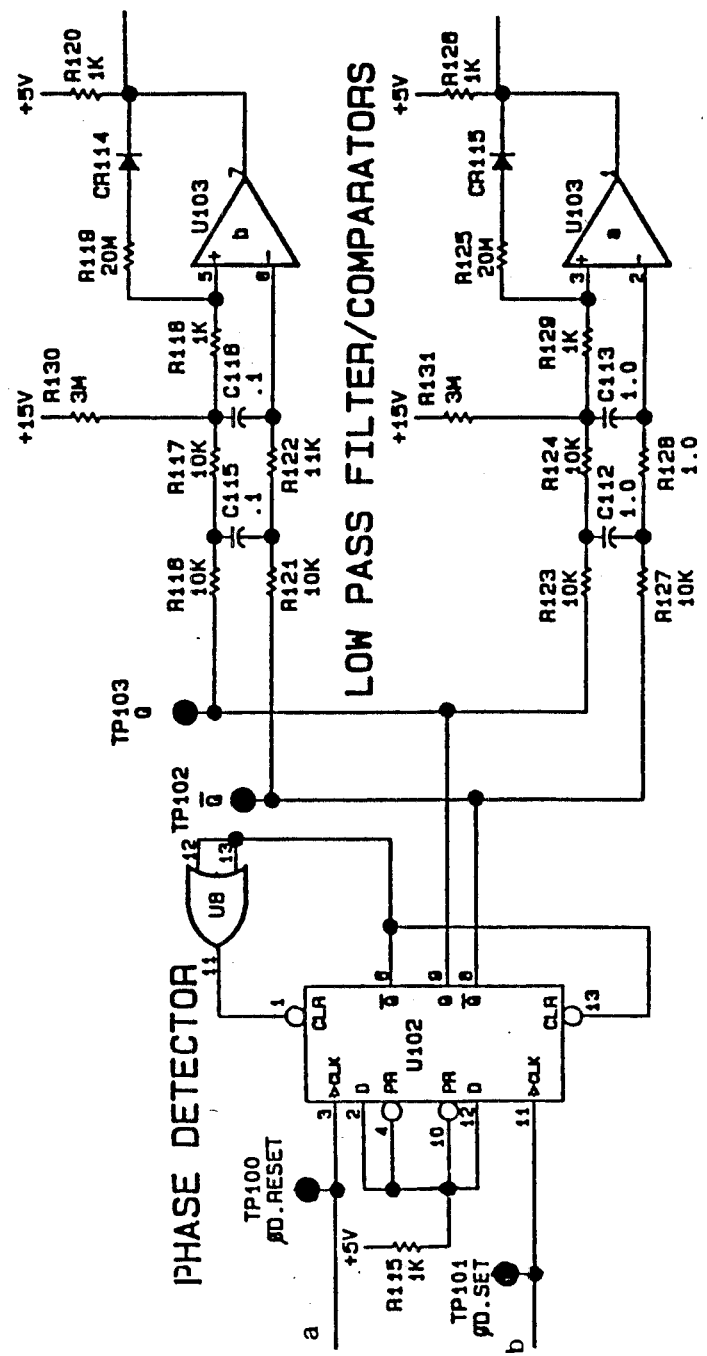

The high frequency operation of this phase detector 313 preferably dictates the use of a dual Schottky TTL flip-flop for the design. In referring to the phase diagram of FIG. 10AB, both of the low pass filter 314 and the comparator 315 are functionally discussed in greater detail hereinbelow. The low pass filter 314 and the comparator 315 actually consist of two circuits respectively as shown in FIGS. 12A–C which shows the detailed circuit configuration of the calibration system for the design. The filter 314 and the comparator 315 signal the controller 214 when the phase of the input signals A and B passes through 180 degrees. In the following discussion, the two filters and the two comparators are respectively identical except filter cutoff frequency. The low path filter 314 acts differentially on the true output Q and the complement output $\overline{Q}$ of the phase detector 313, removing their AC components and presenting their DC components to the input of the comparator 315. As the phase between the input signals varies between 0 and 360 degrees, the true output Q of the phase detector 313 will vary from 0% duty cycle to 100%, hence its DC component will vary the TTL output level from low to high. The complement output $\overline{Q}$ will vary in the opposite manner for the same input phase change that the complement output $\overline{Q}$ will vary from 100% duty cycle to 0%, and that its DC component will vary the TTL output level from high to low. The two DC components will then cross each other when the input signal passes through 180 degrees, and the comparator output will change state, signalling the controller 204. This relationship is shown in FIG. 10A which describes the relationship between the DC components of the outputs Q and $\overline{Q}$ and the phase of the inputs, and in FIG. 10B which describes the relationship between the comparator output and the phase of the inputs. The two filters consisting of the filter 314 are included in the above discussion because circuit operation speed is directly proportional to filter cutoff frequency, or setting time. Low frequency inputs require use of the "slower" filter, while for higher frequency inputs the "fast" filter can be used.

The high gain of the comparator 315 enhances the resolution of the entire phase detection scheme, as the volts/degree at the phase detector output is rather small, i.e., 3.6 volts per 360 degrees or 10 mV per degree. This figure is closer to 500 volts/degree at the comparator output. This allows the controller 204 to detect phase changes on the order of 0.003 degrees. Hence, the calibration system of the invention allows the controller based on a microprocessor to perform phase calibration and to measure and correct for the instrument's phase vs. amplitude characteristic. The input reversing relay 310 is used to allow phase calibrations with the phase detector 313 hooked up normally or with its inputs reversed. By doing two calibrations, one with inputs reversed and one without, systematic errors can be eliminated by averaging the results obtained. The systematic errors should be considered as follows. The circuit shown in FIG. 12 has several sources of error, such that 180 degrees may be indicated when there is actually a finite phase offset. These include:

(1) Unequal propagation delay in the two signal paths.
(2) Unequal high and low voltage levels for the phase detector outputs Q and $\overline{Q}$.
(3) Input offset voltage on the comparator.
(4) Input offset voltage on the zero crossing detectors.
(5) Crosstalk between the zero crossing detectors.
   (One's output transition affecting the timing of the other.)

Herein lies one of the contributions of this phase calibration technique.

In referring to FIG. 6 through FIG. 12, the embodiment of the invention is more fully described hereinbelow as regards the step by step procedure by which the phase calibration system works.

Step 1: The output signals A and B of the sources 301 and 302 are connected to the phase detector circuit 303 via the input reversing relay 310.

Step 2: The controller 204 increments the phase of the channel B until the phase detector 313 indicates that the phase of the channel B with respect to the channel A is between zero and 180 degrees.

Step 3: The phase of the channel B is incremented until the phase of the channel B with respect to the channel A just exceeds 180 degrees.

Step 4: The phase of the channel B is decremented until the phase of the channel B with respect to the channel A is just less than 180 degrees.

Step 5: Steps 3 and 4 are repeated alternately with the phase increments getting successively smaller in an approximately binary fashion. The initial increment is 90 degrees and the final is 0.009 degrees.

Step 6: The value of the phase of the channel B at the end of the step 5 is stored away.

Step 7: The inputs A and B of the phase detector 313 are reversed via the input reversing relay 310.

Step 8: The steps 3 through 5 are repeated, with the direction of all phase increments reversed.

Step 9: The value of the phase of the channel B resulting from the step 8 is averaged with the value stored in the step 6, and this angle is defined in the phase of the channel B with respect to the channel A equal to 180 degrees.

Step 10: The phase of the channel B is updated to reflect the phase of the channel B with respect to the channel A which the user has programmed (i.e., if zero degrees is programmed, the phase of the channel B will be decremented 180 degrees).

Step 11: The output signals A and B of the sources 301 and 302 are disconnected from the phase detector.

At the end of the step 5 the phase detector circuit 303 indicates that the phase of the channel A with respect to the channel B is 180 degrees. However, real phase detector circuits are far from ideal in that errors will be introduced due to propagation delays, comparator offset voltages, electrical crosstalk, and many other factors as discussed as the systematic errors. Although the phase calibration system is designed to be as precise as possible, this result can be off by as much as several tenths of degrees at low frequencies, and as much as several tens of degrees at high frequencies. By reversing the inputs to the phase detector circuit and performing another calibration, an identical error is introduced, but with opposite sign. By averaging the results of the two calibrations, most phase detector circuit errors are effectively cancelled out.

The advantage of this calibration technique is that the phase detector need not be as accurate as the desired phase results, but it merely needs to have very good resolution and be repeatable in the short term.

Figure 11:
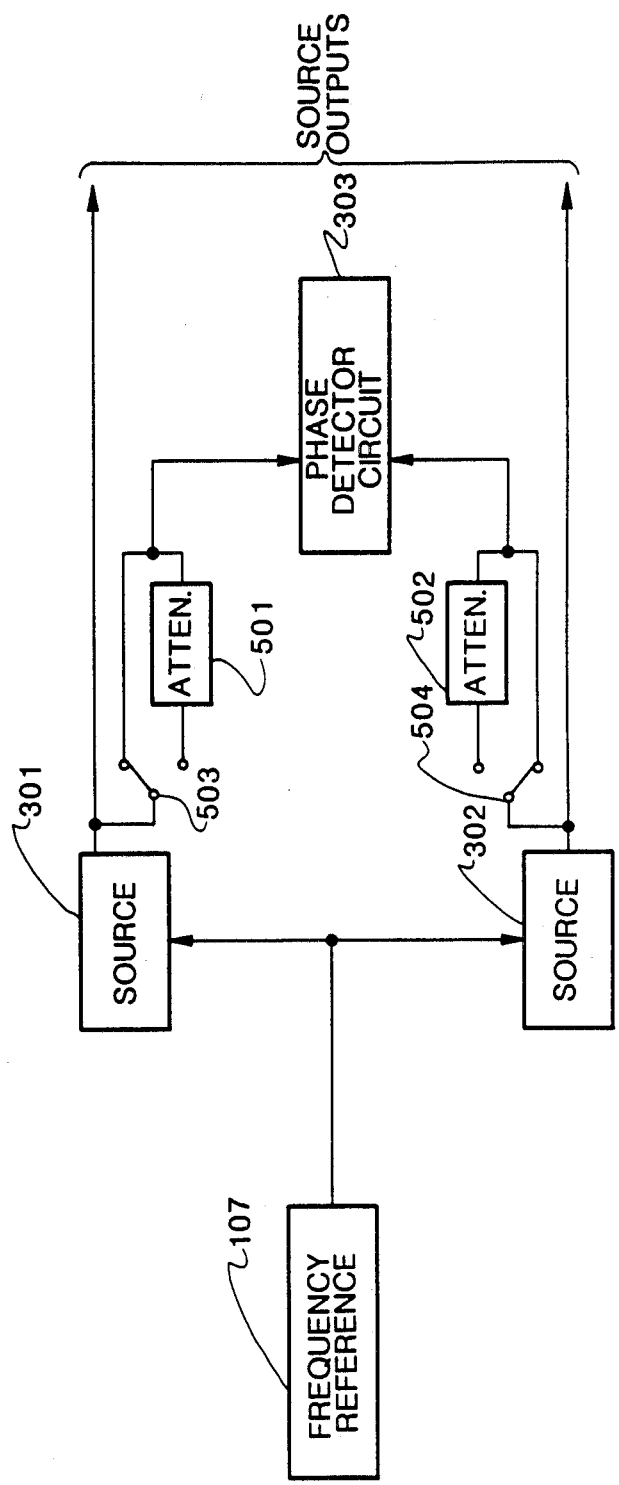
FIG. 11 is a simplified system block diagram of an another embodiment of the invention describing improved phase calibration system of the signal synthesizer system.

In referring to FIG. 11, a modification of the embodiment of the calibration system will be discussed. In consideration of the systematic errors, another error source not compensated for by the two pass averaging technique described above is input offset voltage on the zero crossing detectors, when unequal amplitude input signals are calibrated. Two attenuators 501 and 502 have been added to the FIG. 6. When the attenuators 501 and 502 are switched in by two switches 503 and 504, they attenuate the inputs to the phase detector circuit 303 by a given amount (10dB in this case) and add negligible phase shift at the frequencies of interest. To remove the error discussed above, the following steps should be taken.

Step 1*: The sources 301 and 302 are set to the desired frequency and an arbitrary level, switches as shown in FIG. 11.

Step 2*: A one pass phase calibration is performed.

Step 3*: One attenuator 501 is switched in.

Step 4*: Another calibration is performed, and the difference in phase between this result and that of Step 2* is recorded.

Step 5*: From the information obtained, the offset voltages for both zero crossing detectors can be calculated.

After performing the above steps, signals of differing amplitude can be phase calibrated, and correction factors are calculated from the known offset voltages.

The addition of these attenuators 501 and 502 has another advantage. Most sources show the tendency to vary the phase of their outputs as the amplitude is varied. This is undesirable, because a phase calibration is then only good for the signal amplitude chosen. By using the attenuators in the "put and take" technique described above, the source phase vs. amplitude characteristic can be approximated as follows.

Step 1**: One source 301 is set full scale and the associated attenuator 501 is switched in.

Step 2**: The other source 302 is set to an arbitrary level.

Step 3**: A one pass phase calibration is performed.

Step 4**: The first source 301 is reduced 10dB and the attenuator 501 switched out. The amplitudes of the phase detector circuit 303 are unchanged.

Step 5: Another phase calibration is performed, and this result is compared to that of Step 3.

Step 6**: From this information, the phase vs. amplitude characteristic can be linearly approximated over the 10dB range from the source 301 chosen.

Step 7: Steps "1 through 7**" can be repeated for the other source 302.

With the information obtained above, errors can be minimized by changing phase when entering a desired amplitude change. This technique can be expanded by using multistep attenuators to obtain a multi-segment approximation of the phase vs. amplitude characteristic.

We claim:

1. A signal synthesizer system comprising:
   common frequency reference means for providing a frequency reference;
   first signal source means combined wit the common frequency reference means for providing a first signal output having a first desired frequency;
   second signal source means combined with the common frequency reference means for providing a second signal output having a second desired frequency;
   common controller means coupled to the first and second signal source means for providing a predetermined relationship between the first and second signal outputs; and
   phase detector circuit means coupled to the first and second signal source means for providing a calibrated Phase offset between the first and second signal outputs.

2. A signal synthesizer system according to claim 1, wherein the first and second signal source means are programmable in frequency, amplitude, and phase.

3. A signal synthesizer system according to claim 1, wherein said first and second desired frequencies are the same for the first and second signal outputs with a variable phase offset of the second signal output with respect to the first signal output.

4. A signal synthesizer system according to claim 1, wherein the first and second signal outputs are variable duty cycle square waves and are complementary to each other.

5. A signal synthesizer system according to claim 1, wherein the common controller means consist of a microprocessor.

6. A signal synthesizer system according to claim 1, wherein the first and second signal sources consist of a fractional-N base local oscillator respectively.

7. A signal synthesizer system comprising:
common frequency reference means for providing a frequency reference;
first signal source means combined with the common frequency reference for providing a first signal output having a first variable frequency;
second signal source means combined with the common frequency reference means and the first signal source means for providing a second signal output having a second variable frequency;
common controller means coupled to the first and second signal source means for providing the first and second signal outputs with a variable phase offset of the second signal output with respect to the first signal output; and
phase detector circuit means coupled to the first and second signal source means for providing a selectable calibrated phase offset between the first and second signal outputs.

8. A signal synthesizer system comprising:
common frequency reference means for providing a fixed frequency reference;
first signal source means combined with the common frequency reference means for providing a first signal output having a first variable frequency;
second signal source means combined with the common frequency reference means for providing a second signal output having a second variable frequency;
common controller means coupled to the first and second signal source means for controlling the first and second signal means for providing the first and second signal outputs with the first and second variable frequencies which are respectively independent;
mixer means coupled to the common frequency reference means and the first and second signal source means to obtain a desired frequency range for the first and second signal outputs;
low pass filter means combined with the common frequency reference means and the first and second signal source means to reject high frequency images of the first and second signal outputs;
attenuator means combined with the common frequency reference means and the first and second signal source means to provide the first and second signal outputs with the desired range of gains; and
phase detector circuit means coupled to the first and second signal source means for providing a selectable calibrated phase offset between the first and second signal outputs.

9. A signal synthesizer system comprising:
common frequency reference means for providing a frequency reference;
first signal source means combined with the common frequency reference means for providing a first signal output having a first variable frequency;
second signal source means combined with the common frequency reference means and the first signal source means for providing a second signal output having a second variable frequency;
common controller means coupled to the first and second signal source means for providing the first and second signal outputs with variable duty cycle square waves, said square waves being complementary to each other; and
phase detector circuit means coupled to the first and second signal source means for providing a selectable calibrated phase offset between the first and second signal outputs.

10. A signal synthesizer system comprising: common frequency reference means for providing a fixed frequency reference; first signal source means combined with the common frequency reference means for providing a first variable frequency of a first signal output;
second signal source means combined with the common frequency reference means and the first signal source means for providing the variable frequency of a second signal output;
common controller means coupled to the first and second signal source means for providing the first and second signal outputs with variable duty cycle square waves and being complementary to each other;
mixer means coupled to the common frequency reference means coupled to the common frequency reference means and the first and second signal source means to obtain the desired frequency ranges of the first and second signal outputs;
low pass filter means combined with the common frequency reference means and the first and second signal source means to amplify the first and second signal outputs;
square pulse circuit means coupled to the common frequency reference means and the first and second signal source means to square up and combine the first and second signal outputs in such a fashion as to yield a pulse waveform;
amplifier means combined with the common frequency reference means and the first and second signal source means to amplify the first and second signal outputs;
attenuator means combined with the common frequency reference means and the first and second signal source means to provide the first and second signal outputs with the desired range of gains;
phase detector circuit means coupled to the first and second signal source means for providing a calibrated phase between the first and second signal outputs.

11. A signal synthesizer system comprising:
common frequency reference means for providing a frequency reference;
first signal source means combined with the common frequency reference means for providing a first signal output having a first desired frequency;

second signal source means combined with the common frequency reference means for providing a second signal output having a second desired frequency;

common controller means coupled to the first and second signal source means for providing a predetermined relationship between the first and second signal outputs;

phase detector circuit means coupled to the first and second signal source means for providing a calibrated phase offset between the first and second signal outputs;

zero crossing detector means included in the phase detector circuit means coupled to the first and second signal source means for converting analog waveforms of the first and second signal outputs to digital waveforms of the first and second signal outputs; and sampling means included in the phase detector circuit means for internally sampling the first and second signal outputs to calibrate the phase offset between the first and second signal outputs.

12. A signal synthesizer system according to claim 11, wherein the phase detector circuit means include phase detector means coupled to the first and second signal source means for determining the phase offset between the first and second signal outputs.

13. A signal synthesizer system according to claim 11, wherein the phase detector circuit means include comparator means coupled to the first and second signal source means for detecting a change of the phase offset between the first and second outputs.

14. A signal synthesizer system comprising:
common frequency reference means for providing a frequency reference;
first signal source means combined with the common frequency reference means for providing a desired first signal output;
second signal source means combined with the common frequency reference means for providing a desired second signal output;
common controller means coupled to the first and second signal source means for providing a predetermined relationship between the first and second signal outputs;
phase detector circuit means coupled to the first and second signal source means for providing a calibrated phase between the first and second signal outputs, the circuit means include;
zero crossing detector means coupled to the first and second signal sources for converting analog waveforms of the first and second signal outputs to digital waveforms of the first and second signal outputs,
phase detector means coupled to the zero crossing detector means for determining the phase between the first and second signal outputs;
low pass filter means coupled to the phase detector means for rejecting high frequency images of the first and second signal outputs, and
comparator means coupled to the low pass filter for detecting a change of the phase between the first and second signal output; and
sampling means included in the phase detector circuit means for internally sampling the first and second signal outputs to calibrate the phase between the first and second signal outputs.

15. A signal synthesizer system comprising:
common frequency reference means for providing a frequency reference;
first signal source means combined with the common frequency reference means for providing a desired first signal output;
second signal source means combined with the common frequency reference means for providing a desired second signal output;
common controller means coupled to the first and second signal source means for providing a predetermined relationship between the first and second signal outputs;
switching means coupled to the first and second signal source means for alternatively switching the desired first and second signal outputs;
phase detector circuit means coupled to the switching means for providing a calibrated phase between the first and second signal outputs; and
sampling means included in the phase detector circuit means for internally sampling the first and second signal outputs to calibrate the phase between the first and second signal outputs.

16. A signal synthesizer system according to claim 15, wherein the phase detector circuit means include zero crossing detector means coupled to the switching means for converting analog waveforms of the first and second signal outputs to digital waveforms of the first and second signal outputs.

17. A signal synthesizer system according to claim 15, wherein the phase detector circuit means include phase detector means coupled to the switching means for determining the phase between the first and second signal outputs.

18. A signal synthesizer system according to claim 15, wherein the phase detector circuit means include low pass filter means coupled to the switching means for rejecting high frequency images of the first and second signal outputs.

19. A signal synthesizer system according to claim 15, wherein the phase detector circuit means include comparator means coupled to the switching means for detecting a change of the phase between the first and second signal output.

20. A signal synthesizer system comprising:
common frequency reference means for providing a frequency reference;
first signal source means combined with the common frequency reference means for providing a desired first signal output;
second signal source means combined with the common frequency reference means for providing a desired second signal output;
common controller means coupled to the first and second signal source means for providing a predetermined relationship between the first and second signal outputs;
switching means coupled to the first and second signal source means for alternatively switching the desired first and second signal outputs;
phase detector circuit means coupled to the switching means for providing a calibrated phase between the first and second signal outputs, the circuit means include;
zero crossing detector means coupled to the first and second signal sources for converting analog waveforms of the first and second signal outputs to digital waveforms of the first and second signal outputs, phase detector means coupled to the zero crossing detector means for determining the phase between the first and second signal outputs, low pass filter means coupled to the phase detector means for rejecting high frequency images of the first and second signal outputs, and comparator means coupled to the low pass filter for detecting a change of the phase between the first and second signal output; and sampling means included in the phase detector circuit means for internally sampling the first and second signal outputs to calibrate the phase between the first and second signal outputs.

21. A signal synthesizer system comprising:

common frequency reference means for providing a frequency reference;

first signal source means combined with the common frequency reference means for providing a desired first signal output;

second signal source means combined with the common frequency reference means for providing a desired second signal output;

common controller means coupled to the first and second signal source means for providing a predetermined relationship between the first and second signal outputs;

switching means coupled to the first and second signal source means for alternatively switching the desired first and second signal outputs;

attenuator means coupled to the first and second signal source means for attenuating the first and second signal outputs;

phase detector circuit means coupled to the first and second attenuated signal outputs for providing a calibrated phase between the first and second signal outputs; and sampling means included in the phase detector circuit means for internally sampling the first and second signal outputs to calibrate the phase between the first and second signal outputs.

22. A signal synthesizer system according to claim 21, wherein the phase detector circuit means include zero crossing detector means coupled to the first and second signal source means for converting analog waveforms of the first and second signal outputs to digital waveforms of the first and second signal outputs.

23. A signal synthesizer system according to claim 21, wherein the phase detector circuit means include phase detector means coupled to the first and second signal source means for determining the phase between the first and second signal outputs.

24. A signal synthesizer system according to claim 21, wherein the phase detector circuit means low pass filter means coupled to the first and second signal source means for rejecting high frequency images of the first and second signal outputs.

25. A signal synthesizer system according to claim 21, wherein the phase detector circuit means include comparator means coupled to the first and second signal source means for detecting a change of the phase offset between the first and second signal outputs.

26. A signal synthesizer system comprising:

common frequency reference means for providing a frequency reference;

first signal source means combined with the common frequency reference means for providing a first signal output having a first desired frequency;

second signal source means combined with the common frequency reference means for providing a second signal output having a second desired frequency;

common controller means coupled to the first and second signal source means for providing a predetermined relationship between the first and second signal outputs;

switching means coupled to the first and second signal source means for alternatively switching the first and second signal outputs;

attenuator means coupled to the first and second signal source means for attenuating the first and second signal outputs;

phase detector circuit means coupled to the first and second attenuated signal outputs for providing a calibrated phase offset between the first and second signal outputs, the phase detector circuit means include:

zero crossing detector means coupled to the first and second signal source means for converting analog waveforms of the first and second signal outputs to digital waveforms of the first and second signal outputs, phase detector means coupled to the zero crossing detector means for determining the phase offset between the first and second signal outputs, low pass filter means coupled to the phase detector means for rejecting high frequency images of the first and second signal outputs, and comparator means coupled to the low pass filter means for detecting a change of the phase offset between the first and second signal outputs; and sampling means included in the phase detector circuit means for internally sampling the first and second signal outputs to calibrate the phase offset between the first and second signal outputs.

* * * * *